United States Patent
Wu et al.

(10) Patent No.: US 10,811,603 B2
(45) Date of Patent: Oct. 20, 2020

(54) RESISTIVE RANDOM ACCESS MEMORY

(71) Applicant: Winbond Electronics Corp., Taichung (TW)

(72) Inventors: Bo-Lun Wu, Taichung (TW); Chang-Tsung Pai, Taichung (TW); Ming-Che Lin, Taichung (TW); Meng-Hung Lin, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/278,740

(22) Filed: Feb. 19, 2019

(65) Prior Publication Data

US 2020/0266344 A1    Aug. 20, 2020

(51) Int. Cl.
*H01L 45/00* (2006.01)
*G11C 11/56* (2006.01)
(Continued)

(52) U.S. Cl.
CPC ...... *H01L 45/1233* (2013.01); *G11C 11/5685* (2013.01); *H01L 27/2463* (2013.01); *H01L 45/08* (2013.01); *H01L 45/1253* (2013.01); *H01L 45/1608* (2013.01); *H01L 45/1675* (2013.01); *G11C 13/0007* (2013.01); *G11C 2213/31* (2013.01); *G11C 2213/32* (2013.01); *G11C 2213/52* (2013.01); *H01L 23/535* (2013.01); *H01L 45/146* (2013.01); *H01L 45/147* (2013.01)

(58) Field of Classification Search
CPC ............ H01L 45/1233; H01L 45/1253; G11C 13/0002; G11C 13/0007
See application file for complete search history.

(56) References Cited

U.S. PATENT DOCUMENTS 8,350,245 B2 * 1/2013 Tsuji ............... H01L 27/101
257/2
9,236,567 B2 1/2016 Lee
(Continued)

FOREIGN PATENT DOCUMENTS

TW    201519427    5/2015
TW    201828515    8/2018

OTHER PUBLICATIONS

"Office Action of Taiwan Counterpart Application," dated Aug. 19, 2019, p. 1-p. 5.

*Primary Examiner* — Allison Bernstein
(74) *Attorney, Agent, or Firm* — JCIPRNET

(57) ABSTRACT

A resistive random access memory (RRAM) is provided. The RRAM includes a lower electrode, an upper electrode, a first variable resistance layer and a second variable resistance layer. The lower electrode is disposed on a substrate, and is a single electrode or a pair of electrodes electrically connected to each other. The upper electrode is disposed on the lower electrode, and overlaps the lower electrode. The first variable resistance layer and the second variable resistance layer are disposed on the substrate. At least a portion of the first variable resistance layer is disposed between the lower electrode and the upper electrode, and at least a portion of the second variable resistance layer is disposed between the lower electrode and the upper electrode and connected to the first variable resistance layer.

18 Claims, 22 Drawing Sheets

(51) Int. Cl.
*H01L 27/24* (2006.01)
*G11C 13/00* (2006.01)
*H01L 23/535* (2006.01)

(56) References Cited

U.S. PATENT DOCUMENTS 9,806,255 B1 10/2017 Hsu et al.
2014/0374690 A1* 12/2014 Wada .................... H01L 27/249
257/4

* cited by examiner

RESISTIVE RANDOM ACCESS MEMORY

BACKGROUND

Technical Field

The present invention relates to a memory and a method of fabricating the same, and more particularly to a resistive random access memory (RRAM) and a method of fabricating the same.

Description of Related Art

A resistive random access memory (RRAM) has the advantages of fast operation speed and low power consumption, and has become a non-volatile memory widely studied in recent years. In general, a memory cell of an RRAM circuit includes a transistor and an RRAM connected to each other. Each RRAM includes a single variable resistance layer disposed between the upper electrode and the lower electrode. However, this configuration method limits the data retention capability and the storage density of the RRAM.

SUMMARY

The present invention provides an RRAM that can improve the data retention capability and the memory density of the RRAM.

The RRAM of the embodiment of the invention includes a lower electrode, an upper electrode, a first variable resistance layer, and a second variable resistance layer. The lower electrode is disposed on the substrate and is a single electrode or a pair of electrodes electrically connected to each other. The upper electrode is disposed on the lower electrode and overlaps the lower electrode. The first variable resistance layer and the second variable resistance layer are disposed on the substrate. At least a portion of the first variable resistance layer is disposed between the lower electrode and the upper electrode, and at least a portion of the second variable resistance layer is disposed between the lower electrode and the upper electrode and connected to the first variable resistance layer.

In the embodiment of the present invention, by providing the first variable resistance layer and the second variable resistance layer between the lower electrode and the upper electrode of the RRAM, the single RRAM can have at least two different low resistance states (LRS) when turned on. On the other hand, the RRAM has a single high resistance state (HRS) in the off state. In this way, a single RRAM can have at least 3 programming levels and can store 1.5 bits of data. In other words, the RRAM of the embodiment of the present invention can increase the storage density as compared with the RRAM having only a single variable resistance layer between the upper electrode and the lower electrode. Furthermore, through the material selection of the first and second variable resistance layers, the RRAM of the embodiment of the present invention is more likely to increase the current on/off ratio while maintaining the threshold voltage. As a result, the data retention capability of the RRAM can be improved, and the problem of current degradation can be improved.

The above described features and advantages of the invention will be apparent from the following description.

DESCRIPTION OF THE EMBODIMENTS

FIG. 1A to FIG. 1I are schematic cross-sectional views showing structures at various stages of a method of fabricating an RRAM 10 in accordance with some embodiments of the present invention. In some embodiments, the method of fabricating the RRAM 10 includes the following steps.

Figure 1A:
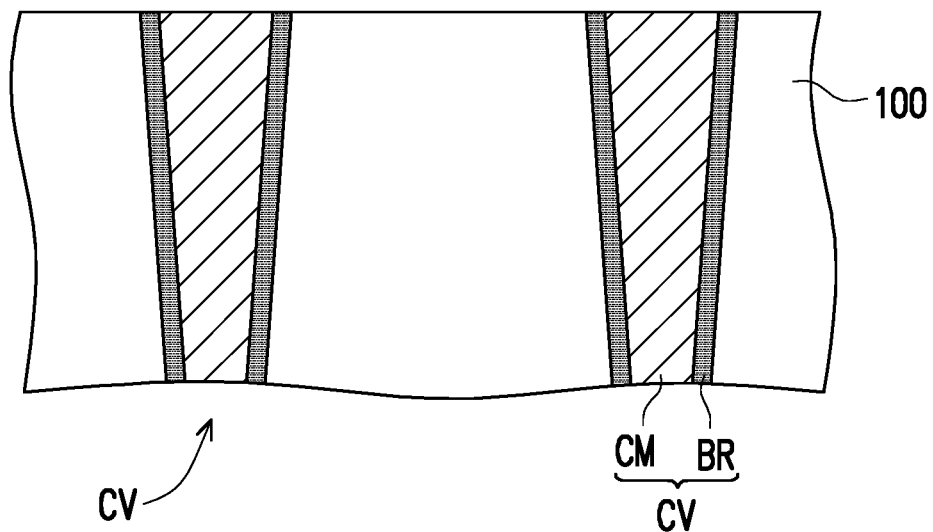
FIG. 1A to FIG. 1I are schematic cross-sectional views showing structures at various stages of a method of fabricating an RRAM according to some embodiments of the present invention.

Referring to FIG. 1A, a substrate 100 is provided. In some embodiments, the substrate 100 includes a semiconductor substrate or a semiconductor on insulator (SOI) substrate. Although not shown in FIG. 1A, electronic components may have been formed in the substrate 100. In some embodiments, the electronic component comprises an active component, a passive component, or a combination thereof. For example, the active component may include a transistor, a diode, or a combination thereof. The aforementioned electronic component may be used to drive a memory component (e.g., the RRAM 10 shown in FIG. 1I) that is subsequently formed on the substrate 100. Further, an interconnect structure may be formed in the substrate 100. In some embodiments, the interconnect structure includes conductive vias CV. The conductive vias CV extend to the surface of the substrate 100 and are electrically connected to the electronic components (e.g., the transistor) formed in the substrate 100. In some embodiments, the conductive vias CV may be electrically connected to the transistors, respectively. In other embodiments, each of the transistors may be electrically connected to at least two adjacent conductive vias CV. In some embodiments, the surface of the substrate 100 has openings, and the conductive vias CV are formed in the openings. In some embodiments, the conductive via CV includes a conductor material CM and a barrier layer BR. The barrier layer BR is disposed between the conductor material CM and the sidewall of the opening, and the conductor material CM is exposed to the surface of the substrate 100. In some embodiments, the conductor material CM may include Al, Cu, W or alloy materials thereof. Further, the material of the barrier layer BR may include TiW, Ti, TiN, Ta, TaN, or a combination thereof.

Figure 1B:
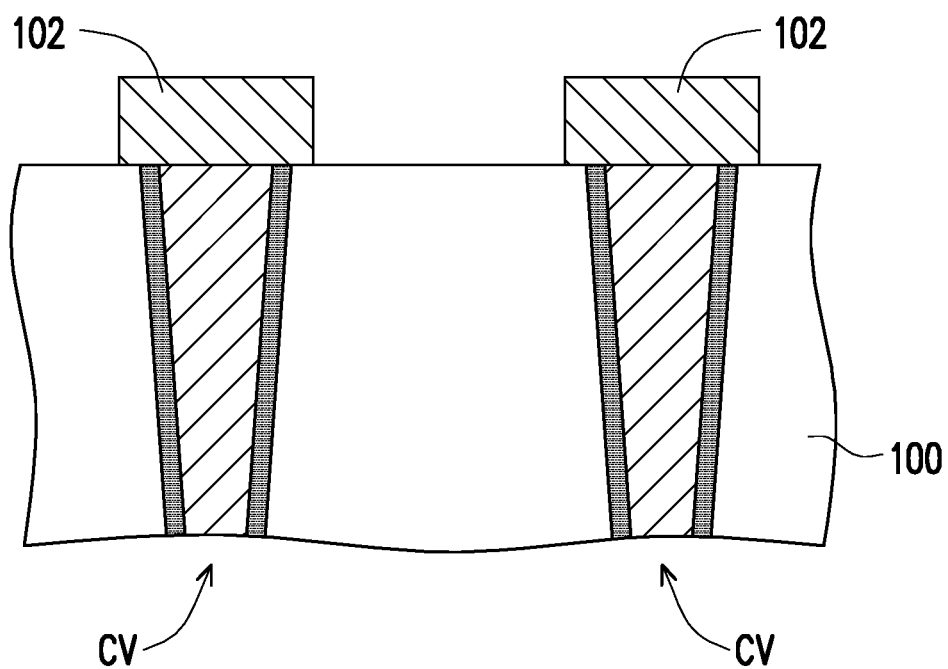

Referring to FIG. 1B, lower electrodes 102 are formed on the substrate 100. In some embodiments, the conductive vias CV respectively are electrically connected to the transistors, and the lower electrodes 102 respectively are electrically connected to the conductive vias CV. In some embodiments, the method of forming the lower electrodes 102 includes forming an electrode material layer (not shown) substantially entirely overlying the substrate 100, followed by patterning the electrode material layer to form the lower electrodes 102. In some embodiments, the method of forming the above electrode material layer may include a physical vapor deposition method (for example, a sputtering process), a chemical vapor deposition method, or an atomic layer deposition process. In some embodiments, the material of the electrode material layer includes Ti, Ta, TiN, TaN, Pt, Ir, graphite, or a combination thereof. In other embodiments, the material of the electrode material layer includes TiAlN, TiW, W, Ru, or a combination thereof. Further, the lower electrode 102 may have a thickness of 5 nm to 50 nm.

Figure 1C:
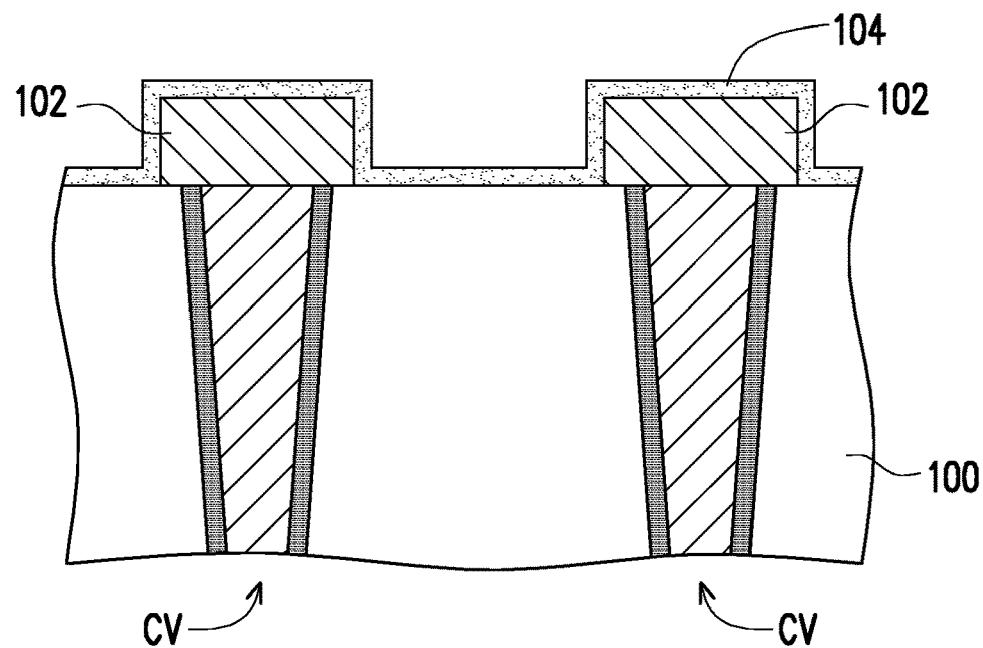

Referring to FIG. 1C, a variable resistance layer 104 is formed on the substrate 100 and the lower electrodes 102. In some embodiments, the variable resistance layer 104 may conformally cover the structure shown in FIG. 1B. In other words, the variable resistance layer 104 may cover the surface of the substrate 100, the top surfaces of the lower electrodes 102, and the sidewalls of the lower electrodes 102. In some embodiments, the material of the variable resistance layer 104 includes $HfO_2$, $ZrO_2$, HfZrO, HfAlO, HfON, HfSiO, HfZrO, HfYO, the like, or a combination thereof. In some embodiments, the method of forming the variable resistance layer 104 may include a physical vapor deposition method (for example, a sputtering process), a chemical vapor deposition method, or an atomic layer deposition process. Further, the variable resistance layer 104 may have a thickness ranging from 2 nm to 10 nm.

Figure 1D:
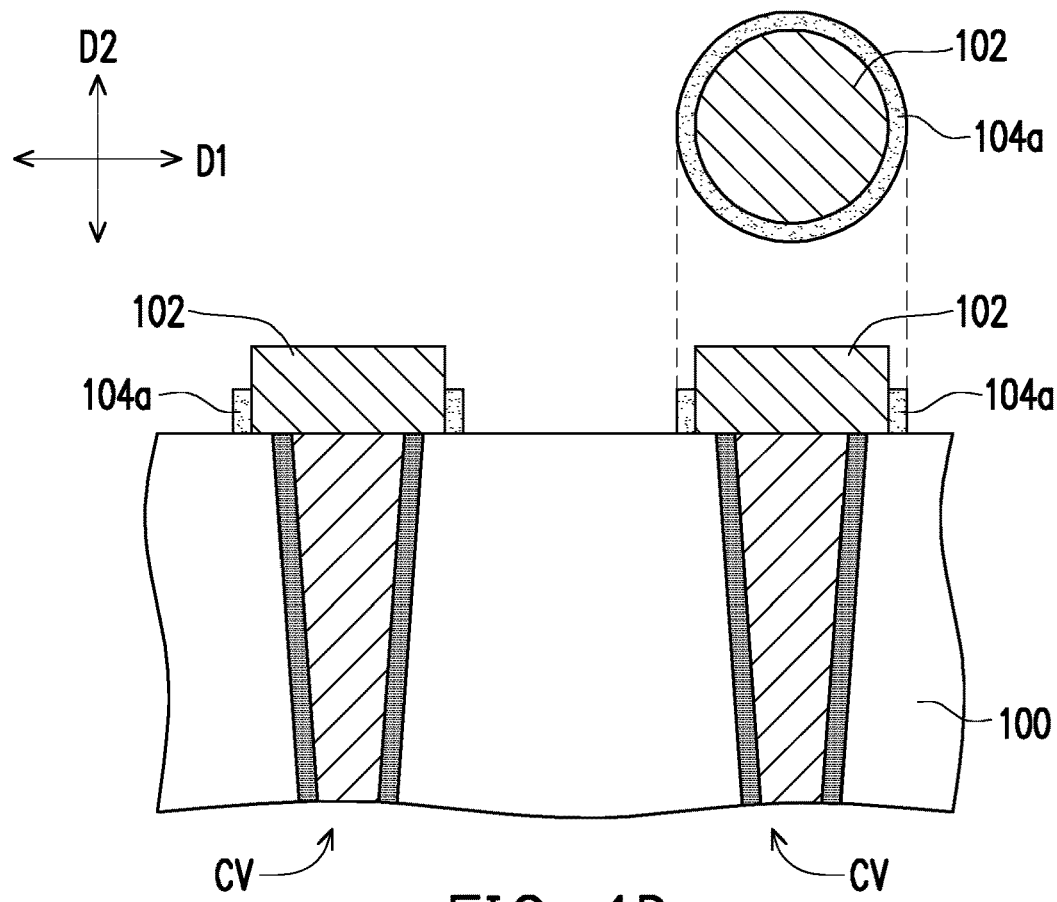

Referring to FIG. 1D, the variable resistance layer 104 is patterned to form first variable resistance layers 104a. In some embodiments, the variable resistance layer 104 may be patterned by an anisotropic etch process. As a result, portions of the variable resistance layer 104 extending in a direction D1 substantially parallel to the surface of the substrate 100 are removed, while portions of the variable resistance layer 104 on the sidewalls of the lower electrodes 102 are left to form the first variable resistance layers 104a. The first variable resistance layer 104a may extend in a direction D2 substantially perpendicular to the surface of the substrate 100. In some embodiments, the first variable resistance layer 104a is located on the sidewall of the bottom of the lower electrode 102 and does not extend to the sidewall of the top of the lower electrode 102. In some embodiments, the height of the first variable resistance layer 104a may range from 5 nm to 50 nm. Viewed from the top view (shown as the area indicated by the dashed line in FIG. 1D), the first variable resistance layer 104a may surround the lower electrode 102.

Figure 1E:
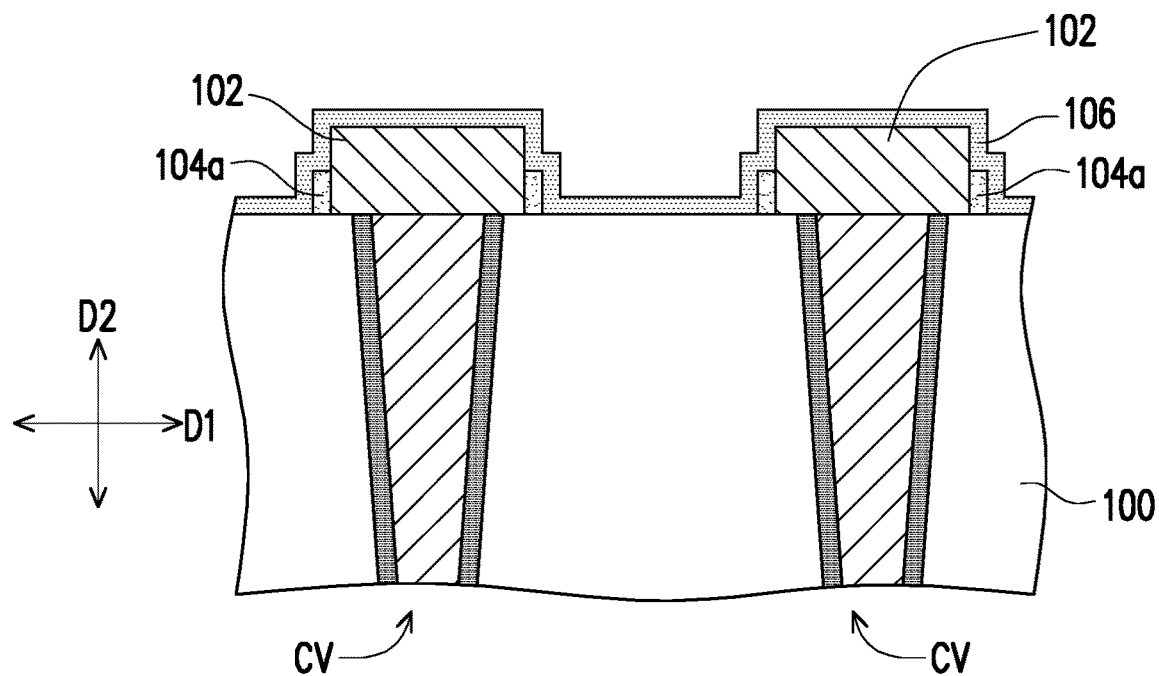

Referring to FIG. 1E, a variable resistance layer 106 is formed on the substrate 100, the first variable resistance layers 104a, and the lower electrodes 102. In some embodiments, the variable resistance layer 106 is conformally disposed on the structure shown in FIG. 1D. In other words, the variable resistance layer 106 may be disposed on the surface of the substrate 100, the surfaces of the first variable resistance layers 104a, the top surfaces of the lower electrodes 102, and portions of the sidewalls of the lower electrodes 102. The material of the variable resistance layer 106 may include $HfO_2$, $ZrO_2$, HfZrO, HfAlO, HfON, HfSiO, HfSrO, HfYO, the like, or a combination thereof. In some embodiments, the material of the variable resistance layer 106 is different from the material of the variable resistance layer 104 (or the first variable resistance layer 104a). In such embodiments, a subsequently formed RRAM (e.g., RRAM 10 of FIG. 1I) may have two different low resistance states (LRS) when turned on. In some embodiments, the method of forming the variable resistance layer 106 may include a physical vapor deposition method (for example, a sputtering process), a chemical vapor deposition method, or an atomic layer deposition process. Further, the variable resistance layer 106 may have a thickness ranging from 2 nm to 10 nm.

Figure 1F:
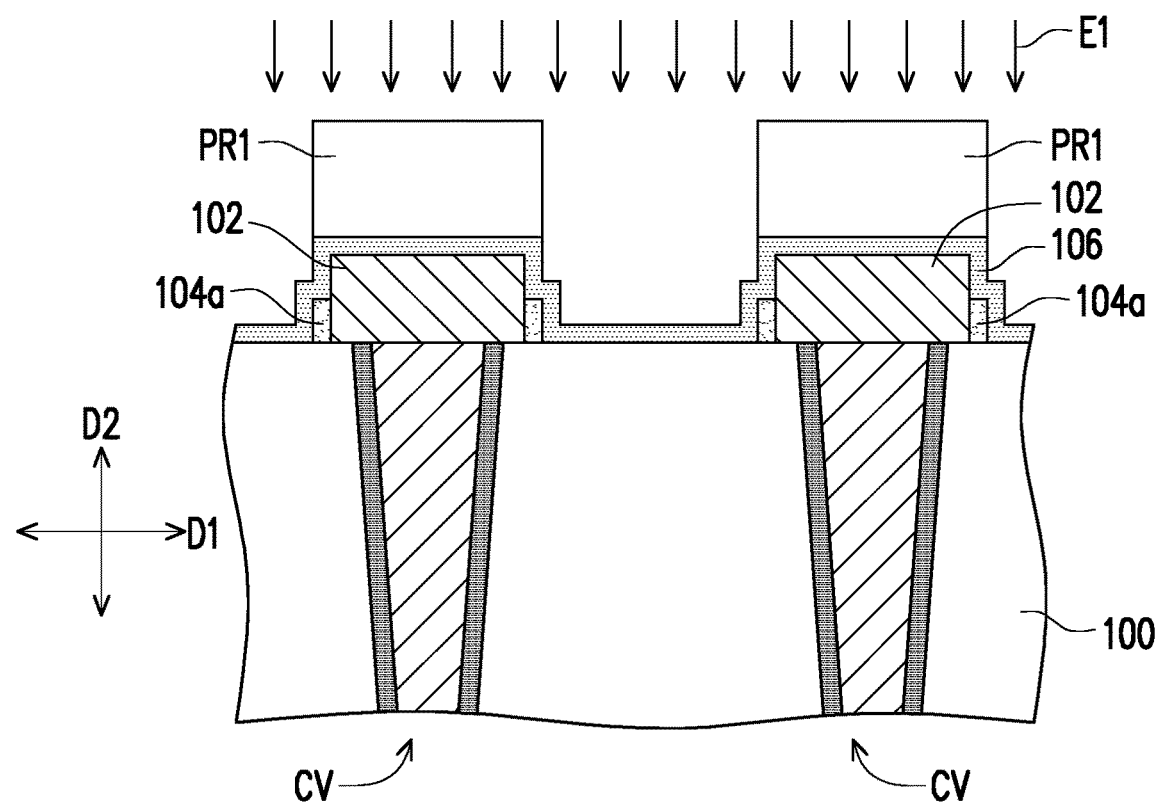
Figure 1G:
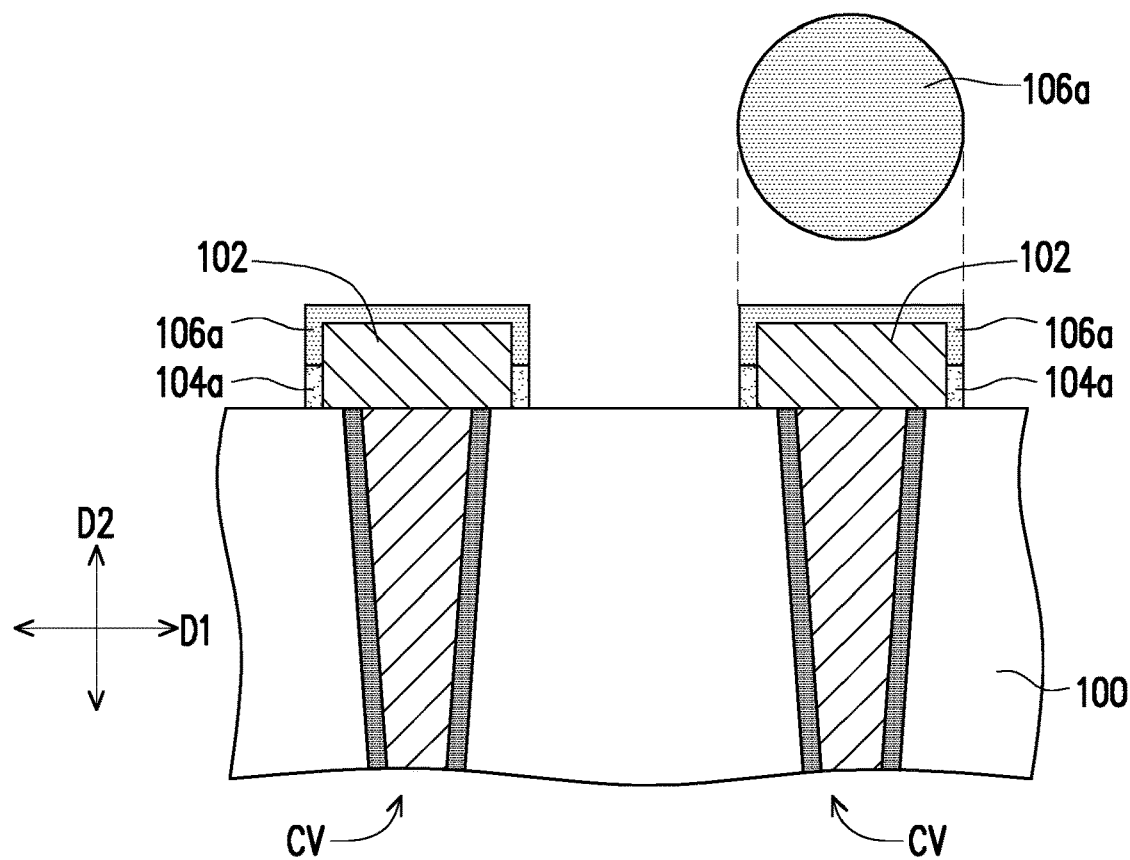

Referring to FIG. 1F and FIG. 1G, the variable resistance layer 106 is patterned to form second variable resistance layers 106a. In some embodiments, the method of patterning the variable resistance layer 106 includes forming a photoresist pattern PR1 on the variable resistance layer 106. The photoresist pattern PR1 exposes a portion of the variable resistance layer 106 between the adjacent first variable resistance layers 104a, and covers another portion of the variable resistance layer 106 over the first variable resistance layers 104a and the lower electrodes 102 in the direction D2. Next, an etching process E1 may be performed to remove the exposed portion of the variable resistance layer 106. As a result, the second variable resistance layers 106a as shown in FIG. 1G may be formed and a portion of the substrate 100 may be exposed. The second variable resistance layer 106a covers the sidewall of the top of the lower electrode 102 and covers the top surface of the lower electrode 102. In some embodiments, the first variable resistance layer 104a and the second variable resistance layer 106a substantially completely cover the sidewall and the top surface of the lower electrode 102. Further, the second variable resistance layer 106a partially overlaps the first variable resistance layer 104a in the direction D2. Viewed from the top view (shown as the area indicated by the dashed line in FIG. 1G), the second variable resistance layer 106a covers the lower electrode 102 and the first variable resistance layer 104a. In some embodiments, a portion of the sidewall of the second variable resistance layer 106a is substantially coplanar with the sidewall of the first variable resistance layer 104a.

Figure 1H:
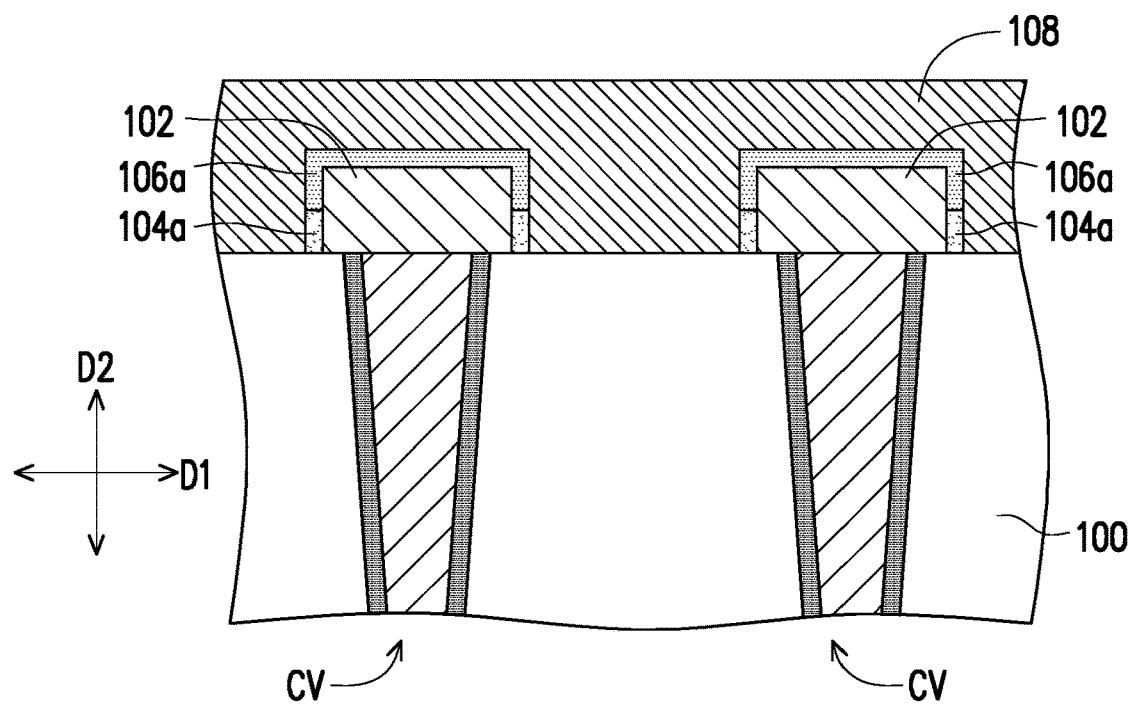

Referring to FIG. 1H, an electrode material layer 108 is formed on the substrate 100 and the second variable resistance layers 106a. In some embodiments, the electrode material layer 108 may be entirely overlaid on the structure shown in FIG. 1G. In other words, the electrode material layer 108 may cover the surface of the substrate 100, the sidewalls of the first variable resistance layers 104a, and the sidewalls and the top surfaces of the second variable resistance layers 106a. In some embodiments, the material of the electrode material layer 108 includes Ti, Ta, TiN, TaN, Pt, Ir, graphite, or a combination thereof. In other embodiments, the material of the electrode material layer 108 includes TiAlN, TiW, W, Ru, or a combination thereof. Further, the method of forming the electrode material layer 108 may include a physical vapor deposition method (for example, a sputtering process) or a chemical vapor deposition method.

Figure 1I:
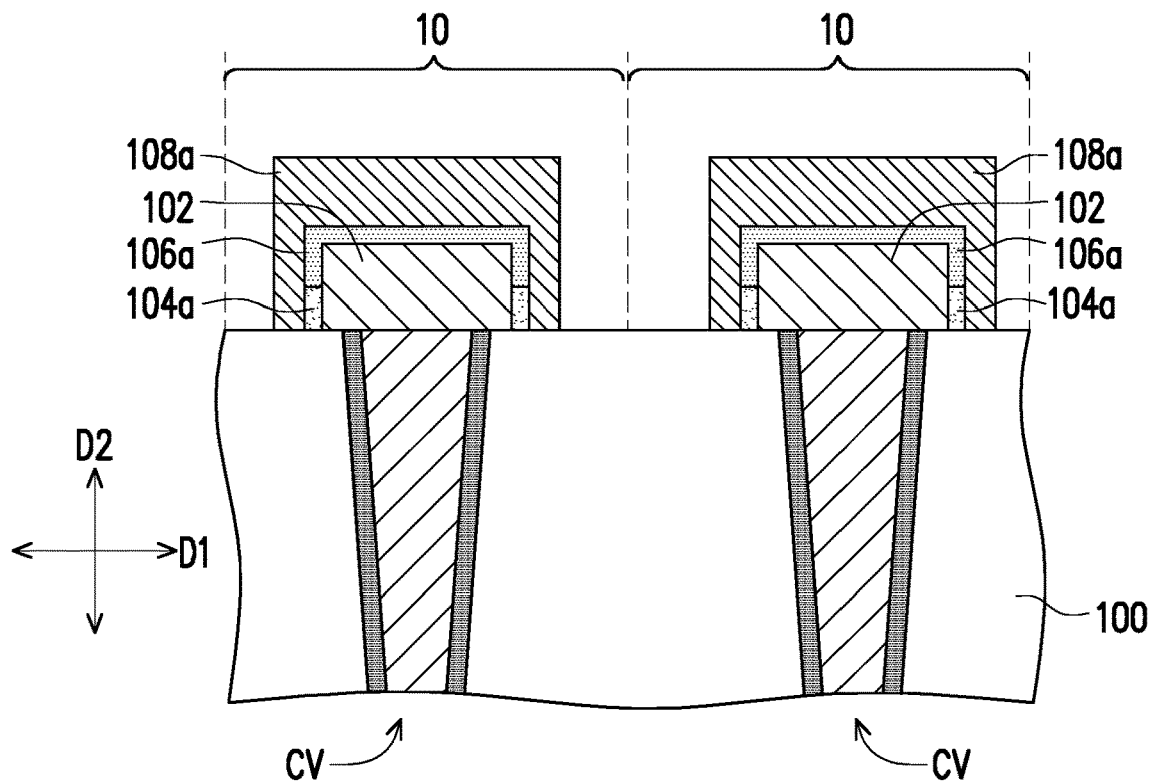

Referring to FIG. 1I, the electrode material layer 108 is patterned to form upper electrodes 108a. In some embodiments, the upper electrode 108a covers the sidewall and the top surface of the second variable resistance layer 106a and covers the sidewall of the first variable resistance layer 104a. In such embodiments, the upper electrode 108a covers the top surface and sidewall of the lower electrode 102. On the other hand, the upper electrodes 108a may expose a portion of the substrate 100.

So far, the RRAMs 10 of some embodiments of the present invention have been formed. The operation of the RRAM 10 includes applying a bias voltage between the upper electrode and the lower electrode. The initial state of the RRAM 10 remains at a high resistance state. When the applied bias voltage reaches a certain threshold voltage, the variable resistance layer (including the first variable resistance layer 104a and the second variable resistance layer 106a) undergoes resistance conversion, that is, from the high resistance state to a low resistance state. In other words, the resistance value of the RRAM 10 is not constant, and its voltage-current characteristic exhibits a non-linear relationship. This non-linear current-voltage relationship can be explained by filament theory. When the RRAM 10 is in a low resistance state, a filament having high conductivity in the variable resistance layer is called a conductive filament. The conductive filament is formed by arranging crystal defects in the variable resistance layer. These defects may often be referred to as oxygen vacancies, i.e., oxygen ions are generated in the variable resistance layer. The electrons can be transferred in the vicinity of the oxygen vacancies by jumping, so that when the oxygen vacancies are arranged in a path connecting the upper electrode and the lower electrode, the conductive filament can be formed. The oxygen vacancies are originally arranged in a random arrangement. When the variable resistance layer is heated by applying a voltage, the oxygen vacancies start to be aggregated by the driving of the voltage and the thermal energy to form the conductive filament. When the conductive filament is formed inside the variable resistance layer, electrons can pass through the RRAM 10 through the conductive path, so the resistance state of the RRAM 10 is changed from the initial high resistance state to the low resistance state.

In the embodiment of the present invention, the first variable resistance layer 104a and the second variable resistance layer 106a of each RRAM 10 are located between the lower electrode 102 and the upper electrode 108a. The upper electrode 108a and the lower electrode 102 overlap in the direction D2 substantially perpendicular to the surface of the substrate 100. In the embodiment shown in FIG. 1I, the lower electrodes 102 of the RRAMs 10 respectively are electrically connected to different transistors by the corresponding interconnect structures (including the conductive vias CV). In this way, the lower electrode 102 of each RRAM 10 may independently receive the driving signals provided by the corresponding transistor. Further, the first variable resistance layer 104a and the second variable resistance layer 106a of the RRAM 10 partially overlap with each other in the direction D2 substantially perpendicular to the surface of the substrate 100.

Based on the above, by providing the first variable resistance layer and the second variable resistance layer between the lower electrode and the upper electrode of the RRAM, the single RRAM can have at least two different low resistance states (LRS) when turned on. On the other hand, the RRAM has a single high resistance state (HRS) in the off state. In this way, a single RRAM can have at least 3 programming levels and can store 1.5 bits of data. In other words, the RRAM of the embodiment of the present invention can increase the storage density as compared with the RRAM having only a single variable resistance layer between the upper electrode and the lower electrode. Furthermore, through the material selection of the first and second variable resistance layers, the RRAM of the embodiment of the present invention is more likely to increase the current on/off ratio while maintaining the threshold voltage. As a result, the data retention capability of the RRAM can be improved, and the problem of current degradation can be improved.

Figure 2A:
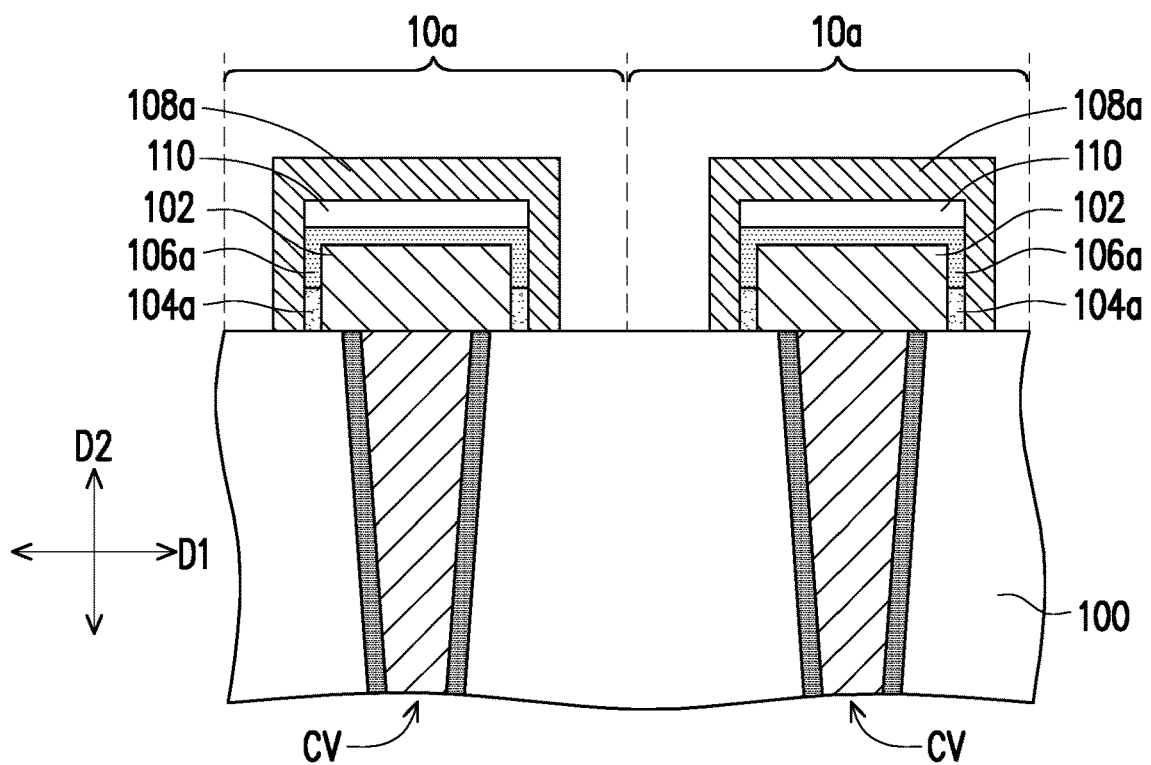
FIG. 2A to FIG. 2C are schematic cross-sectional views of RRAMs in accordance with some embodiments of the present invention.

FIG. 2A is a schematic cross-sectional view of an RRAM 10a in accordance with some embodiments of the present invention. The RRAM 10a shown in FIG. 2A is similar to the RRAM 10 shown in FIG. 1I, and only differences between the two will be described below, and the same or similar portions will not be described again.

Referring to FIG. 1I and FIG. 2A, each RRAM 10a shown in FIG. 2A further includes a first protective layer 110. The first protective layer 110 is disposed between the lower electrode 102 and the upper electrode 108a, and may be located between the second variable resistance layer 106a and the upper electrode 108a. In some embodiments, the first protective layer 110 covers the top surface of the second variable resistance layer 106a. In these embodiments, the first protective layer 110 overlaps the top surface of the lower electrode 102 and overlaps the first variable resistance layer 104a in the direction D2 substantially perpendicular to the surface of the substrate 100. Moreover, in some embodiments, the material of the first protective layer 110 includes silicon oxide, aluminum oxide, titanium oxide, silicon nitride, the like, or a combination thereof. The method of forming the first protective layer 110 may include a chemical vapor deposition method. The thickness of the first protective layer 110 may range from 3 nm to 20 nm. In some embodiments, the first protective layer 110 may be formed after the second variable resistance layer 106a is formed and before the upper electrode 108a is formed. By providing the first protective layer 110, the contact area between the second variable resistance layer 106a and the upper electrode 108a can be adjusted, and thereby the effective operating area ratio of the first variable resistance layer 104a and the second variable resistance layer 106a can be adjusted.

Figure 2B:
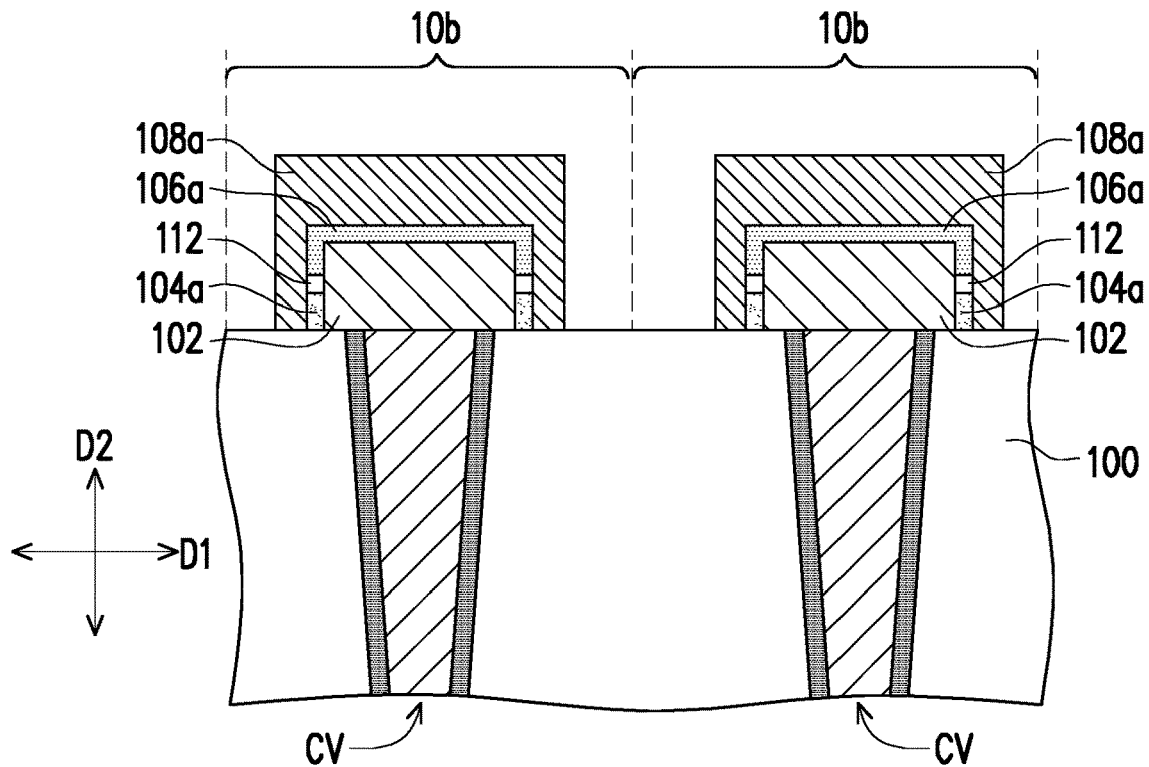

FIG. 2B is a schematic cross-sectional view of an RRAM 10b in accordance with some embodiments of the present invention. The RRAM 10b shown in FIG. 2B is similar to the RRAM 10 shown in FIG. 1I, and only the differences between the two will be described below, and the same or similar portions will not be described again.

Referring to FIG. 1I and FIG. 2B, each RRAM 10b shown in FIG. 2B further includes a second protective layer 112. The second protective layer 112 is disposed between the lower electrode 102 and the upper electrode 108a and is located between the first variable resistance layer 104a and the second variable resistance layer 106a. In some embodiments, the second protective layer 112 may be disposed on the sidewall of the lower electrode 102 and may overlap the first variable resistance layer 104a and a portion of the second variable resistance layer 106a in the direction D2. Moreover, in some embodiments, the material of the second protective layer 112 includes silicon oxide, aluminum oxide, titanium oxide, silicon nitride, the like, or a combination thereof. The method of forming the second protective layer 112 may include a chemical vapor deposition method. The thickness of the second protective layer 112 may range from 3 nm to 20 nm. In some embodiments, the second protective layer 112 may be formed after forming the first variable resistance layer 104a and before forming the second variable resistance layer 106a. By providing the second protective layer 112, the mutual interference between the first variable resistance layer 104a and the second variable resistance layer 106a during operation can be reduced (that is, the oxygen ions and oxygen vacancies are reduced to interfere with each other in the two variable resistance layers).

Figure 2C:
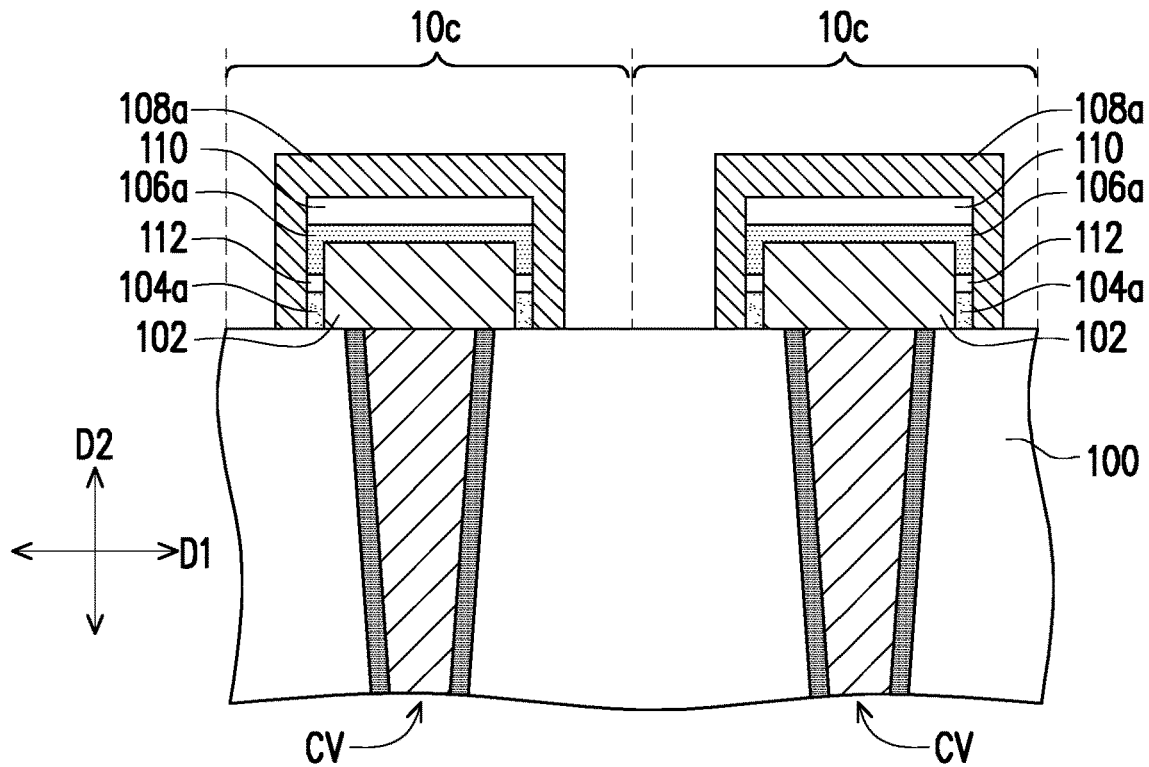

FIG. 2C is a schematic cross-sectional view of an RRAM 10c in accordance with some embodiments of the present invention. The RRAM 10c shown in FIG. 2C is similar to the RRAM 10a shown in FIG. 2A and the RRAM 10b shown in FIG. 2B, and only differences between the two will be described below, and the same or similar portions will not be described again.

Referring to FIG. 2A, FIG. 2B and FIG. 2C, each RRAM 10c shown in FIG. 2C includes both the first protective layer 110 as shown in FIG. 2A and the second protective layer 112 as shown in FIG. 2B. In this way, the effective operating area ratio of the first variable resistance layer 104a and the second variable resistance layer 106a can be adjusted, and the mutual interference generated between the first variable resistance layer 104a and the second variable resistance layer 106a during operation can be prevented.

FIG. 3A to FIG. 3D are schematic cross-sectional views showing structures at various stages of the method of fabricating an RRAM 20 in accordance with some embodiments of the present invention. The fabricating method of the RRAM 20 shown in FIG. 3A to FIG. 3D is similar to the fabricating method of the RRAM 10 shown in FIG. 1A to FIG. 1I, and only differences between the two will be described below, and the same or similar portions will not be described again. Further, the same or similar reference numbers represent the same or similar components.

Figure 3A:
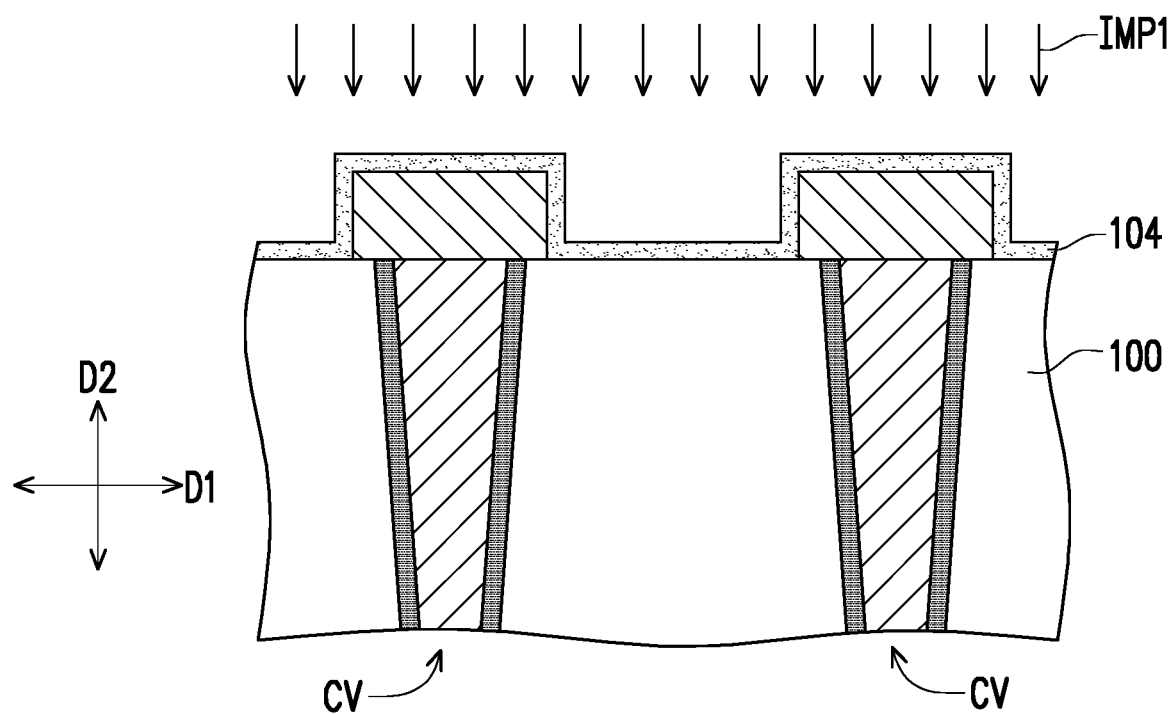
FIG. 3A to FIG. 3D are schematic cross-sectional views showing structures at various stages of a method of fabricating an RRAM according to some embodiments of the present invention.
Figure 3B:
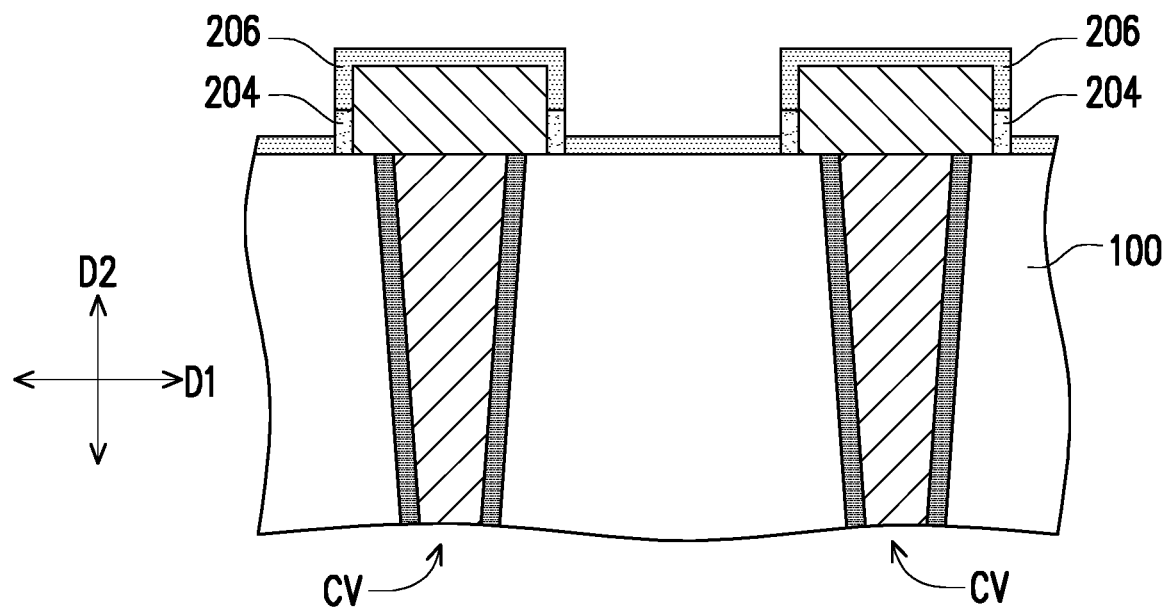

Referring to FIG. 3A and FIG. 3B, after the variable resistance layer 104 is formed, the variable resistance layer 104 is subjected to a doping process IMP1. As such, as shown in FIG. 3B, both of a first variable resistance layer 204 and a second variable resistance layer 206 may be formed. The second variable resistance layer 206 may be regarded as a doped portion of the variable resistance layer 104, and the first variable resistance layer 204 may be regarded as an undoped portion of the variable resistance layer 104. In some embodiments, the dopant may be implanted into the variable resistance layer 104 in the direction D2 that is substantially perpendicular to the surface of the substrate 100. In such embodiments, each first variable resistance layer 204 is located on the sidewall of the bottom of each lower electrode 102. On the other hand, the second variable resistance layer 206 covers the surface of the substrate 100, the top surface of each lower electrode 102, and the sidewall of the top of each lower electrode 102. In some embodiments, the dopant of the doping process IMP1 may include N, Zr, Si, Y, or a combination thereof. The doping concentration of the second variable resistance layer 206 may be $10^{12}$ cm$^{-2}$ to $10^{15}$ cm$^{-2}$.

Figure 3C:
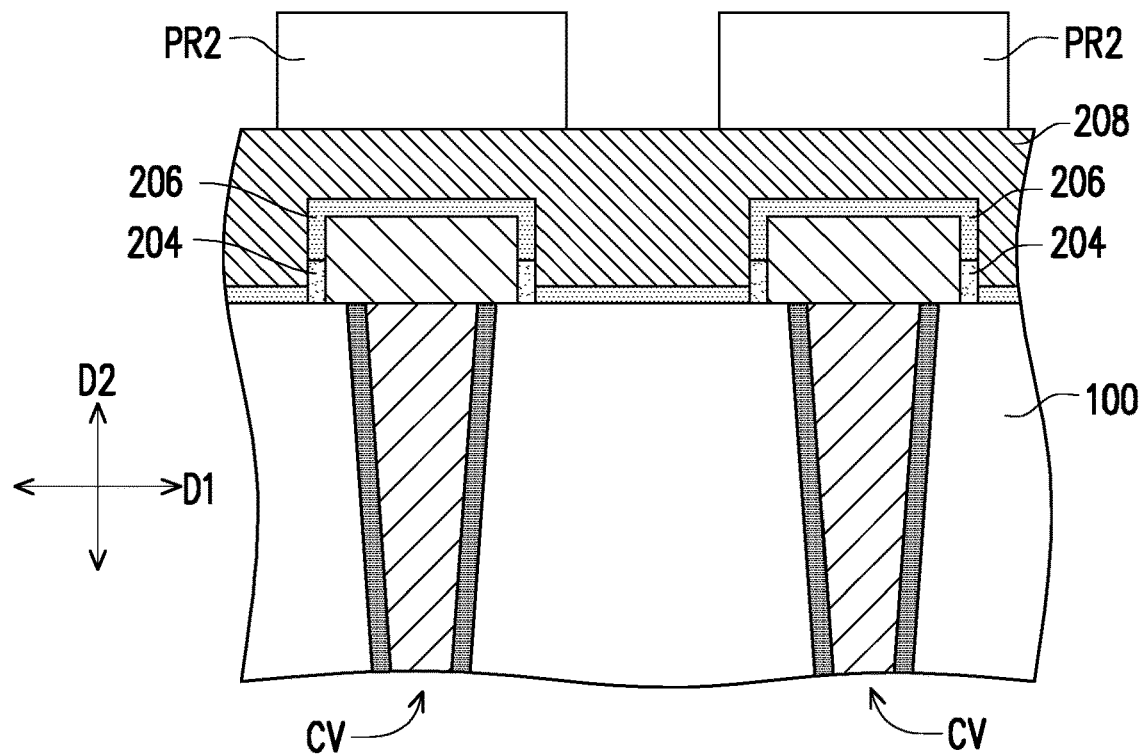

Referring to FIG. 3C, an electrode material layer 208 is formed on the first variable resistance layer 204 and the second variable resistance layer 206. Referring to FIG. 3B and FIG. 3C, the electrode material layer 208 is then patterned to form upper electrodes 208a. In some embodiments, a photoresist pattern PR2 may be formed on the electrode material layer 208. Next, the upper electrodes 208a are formed by removing a portion of the electrode material layer 208 with the photoresist pattern PR2 as a mask. In such embodiments, a portion of the second variable resistance layer 206 on the substrate 100 is also removed during the patterning of the electrode material layer 208. The upper electrode 208a is similar to the upper electrode 108a shown in FIG. 1I except that a portion of the second variable resistance layer 206 on the substrate 100 is retained between a portion of the upper electrode 208a around the lower electrode 102 and the substrate 100. In addition, the said portion of the second variable resistance layer 206 may cover the sidewall of the bottom of the first variable resistance layer 204. So far, the RRAMs 20 have been formed.

Figure 3D:
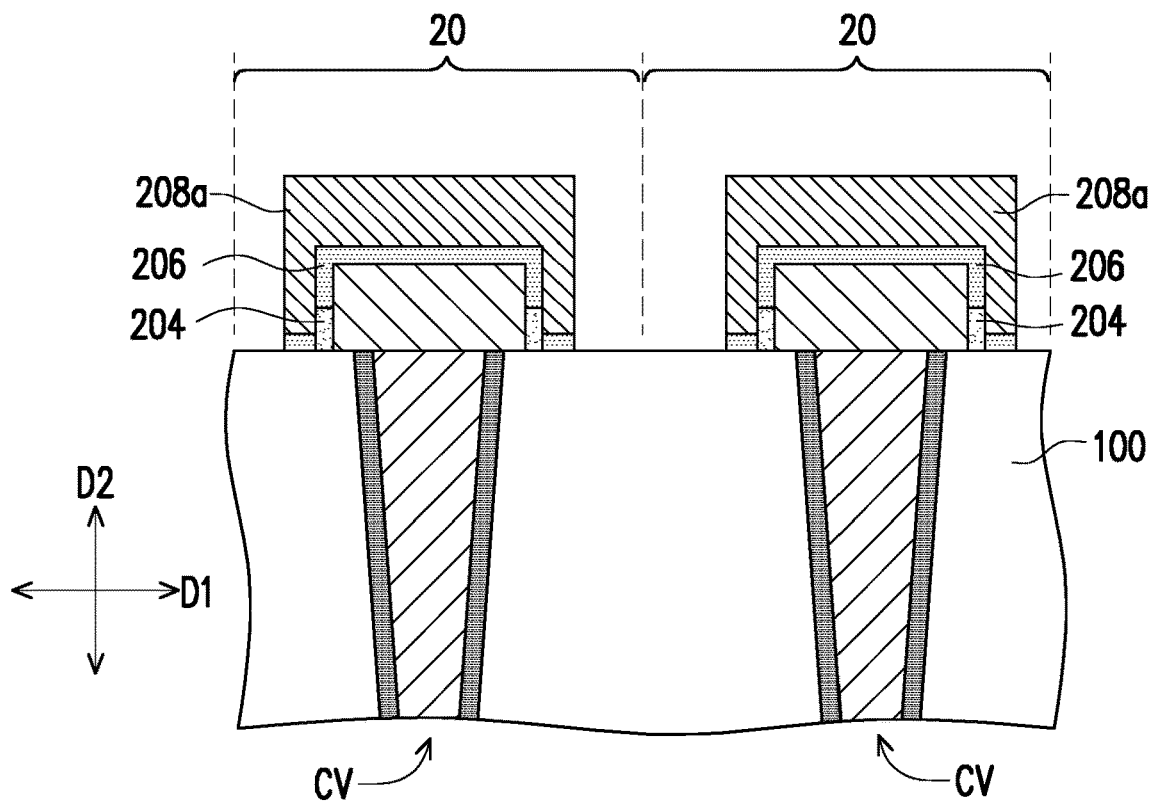
Figure 4:
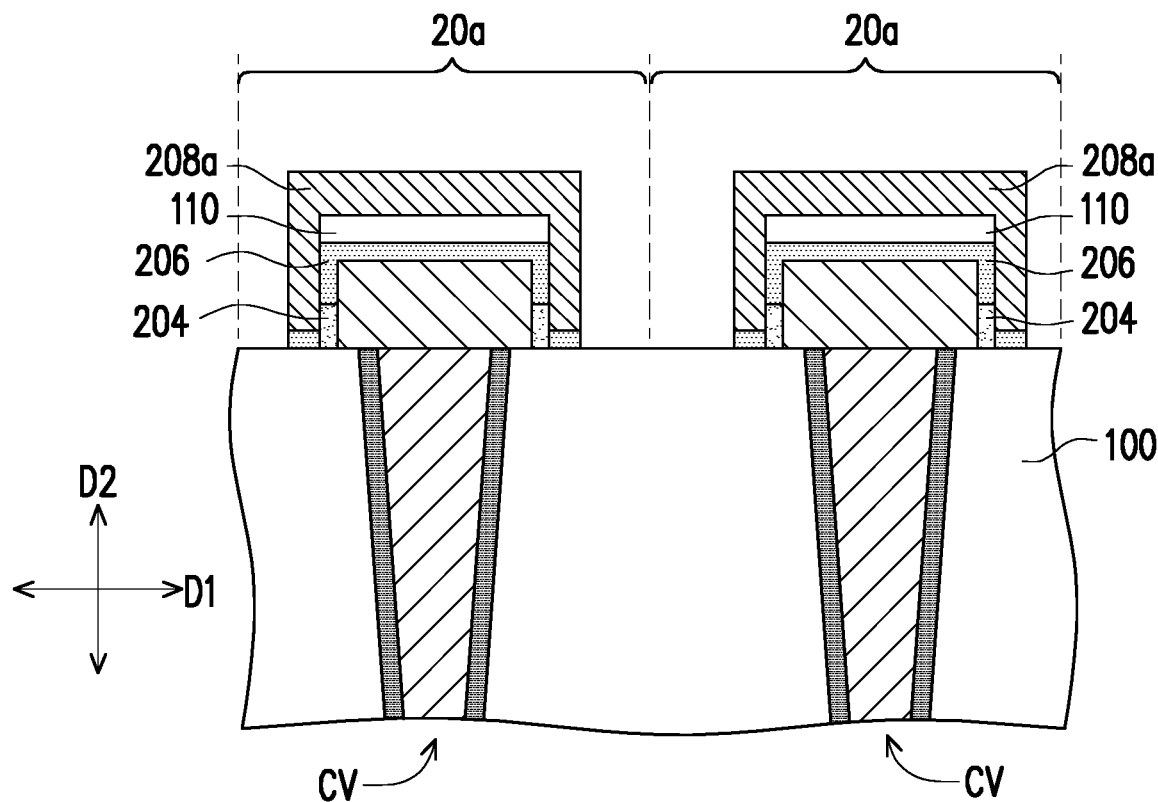
FIG. 4 is a schematic cross-sectional view of an RRAM in accordance with some embodiments of the present invention.

FIG. 4 is a schematic cross-sectional view of an RRAM 20a in accordance with some embodiments of the present invention. The RRAM 20a shown in FIG. 4 is similar to the RRAM 20 shown in FIG. 3D, and only differences between the two will be described below, and the same or similar portions will not be described again.

Referring to FIG. 2A, FIG. 3D and FIG. 4, each RRAM 20a shown in FIG. 4 further includes the first protective layer 110 as shown in FIG. 2A. In some embodiments, the first protective layer 110 does not overlap the portion of the second variable resistance layer 206 located around the first variable resistance layer 204 in the direction D2.

FIG. 5A to FIG. 5E are schematic cross-sectional views showing structures at various stages of the method of fabricating an RRAM 30 of some embodiments of the present invention. The fabricating method of the RRAM 30 shown in FIG. 5A to FIG. 5E is similar to the fabricating method of the RRAM 10 shown in FIG. 1A to FIG. 1I, and only differences between the two will be described below, and the same or similar portions will not be described again. Further, the same or similar reference numbers represent the same or similar components.

Figure 5A:
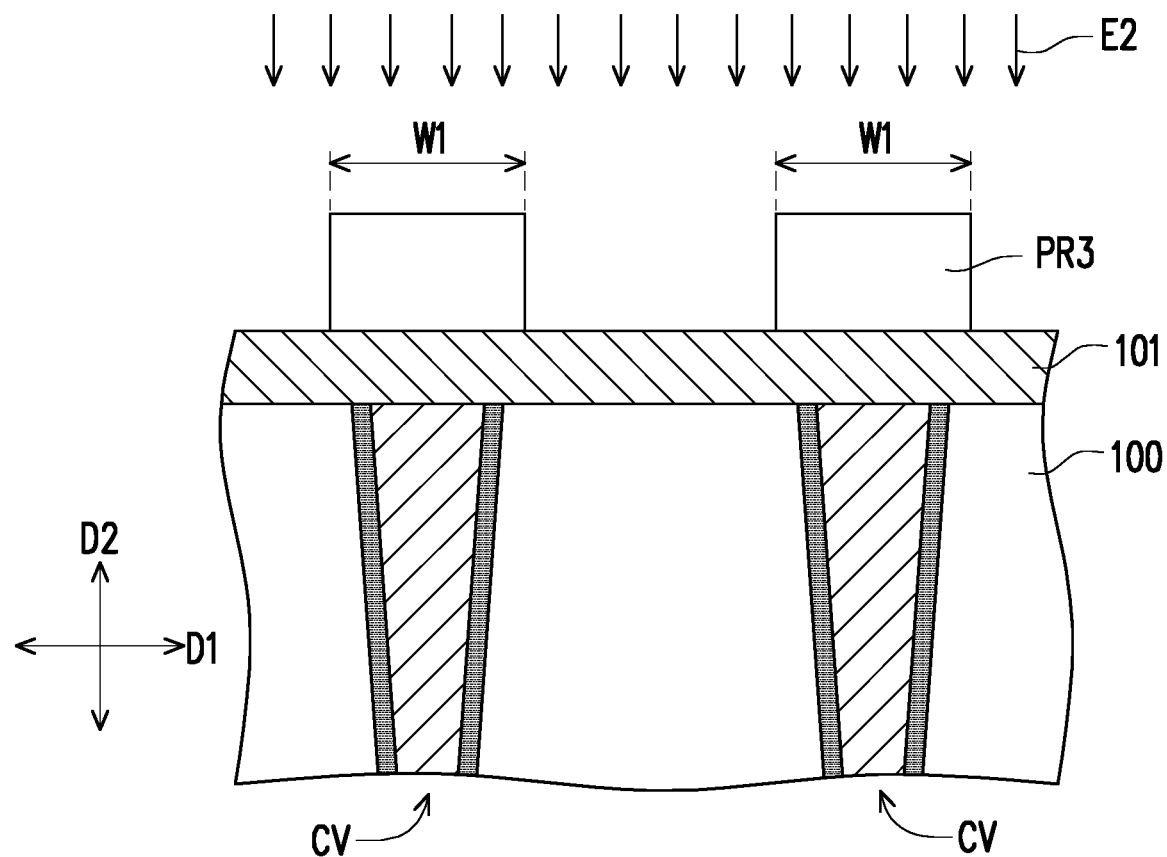
FIG. 5A to FIG. 5E are schematic cross-sectional views showing structures at various stages of a method of fabricating an RRAM according to some embodiments of the present invention.

Referring to FIG. 5A, an electrode material layer 101 is formed on the substrate 100. The method of forming the electrode material layer 101 may include a physical vapor deposition method (for example, a sputtering process), a chemical vapor deposition method, or an atomic layer deposition process. In some embodiments, the material of the electrode material layer 101 includes TiN, TaN, Pt, Ir, graphite, or a combination thereof. In other embodiments, the material of the electrode material layer 101 includes TiAlN, TiW, W, Ru, or a combination thereof. Further, the electrode material layer 101 may have a thickness of 5 nm to 50 nm. Next, referring to FIG. 5A and FIG. 5B, the electrode material layer 101 is patterned to form the lower electrodes 102. In some embodiments, the method of patterning the electrode material layer 101 includes forming a photoresist pattern PR3 on the electrode material layer 101. The photoresist pattern PR3 defines the pattern of the lower electrodes 102. Subsequently, an etching process E2 is performed with the photoresist pattern PR3 as a mask, and a portion of the electrode material layer 101 is removed. As a result, the lower electrodes 102 can be formed.

Figure 5B:
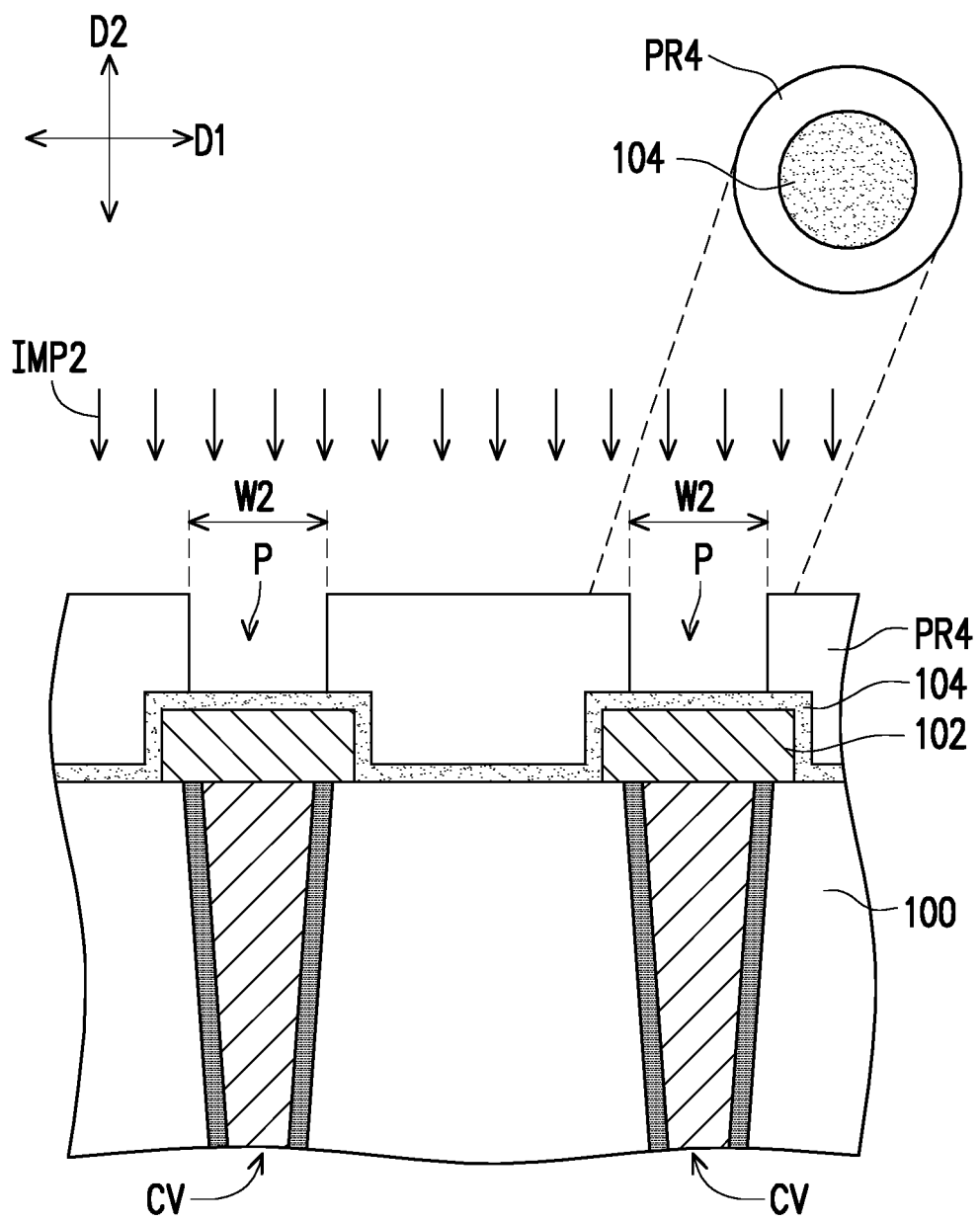

Referring to FIG. 5B, after the variable resistance layer 104 is formed, a photoresist pattern PR4 is formed on the variable resistance layer 104. The photoresist pattern PR4 has openings P. The openings P expose a portion of the variable resistance layer 104 covering the top surfaces of the lower electrodes 102. Viewed from the top view (shown as the area indicated by the dashed line in FIG. 5B), the exposed portions of the variable resistance layer 104 may be surrounded by the photoresist pattern PR4. In some embodiments, the photoresist pattern PR3 shown in FIG. 5A and the photoresist pattern PR4 shown in FIG. 5B may be reverse tones, and the photoresist pattern PR3 and the photoresist pattern PR4 may be formed by the same mask. For example, the photoresist pattern PR3 may be a positive photoresist and the photoresist pattern PR4 may be a negative photoresist, but the embodiment of the present invention is not limited thereto. In some embodiments, the width W1 of the photoresist pattern PR3 is substantially equal to the width of the lower electrode 102 and may be greater than the width W2 of the opening P of the photoresist pattern PR4. In these embodiments, the photoresist pattern PR4 may be formed by being assisted with a technique such as "resolution enhancement lithography assisted by chemical shrinkage (RELACS)".

Figure 5C:
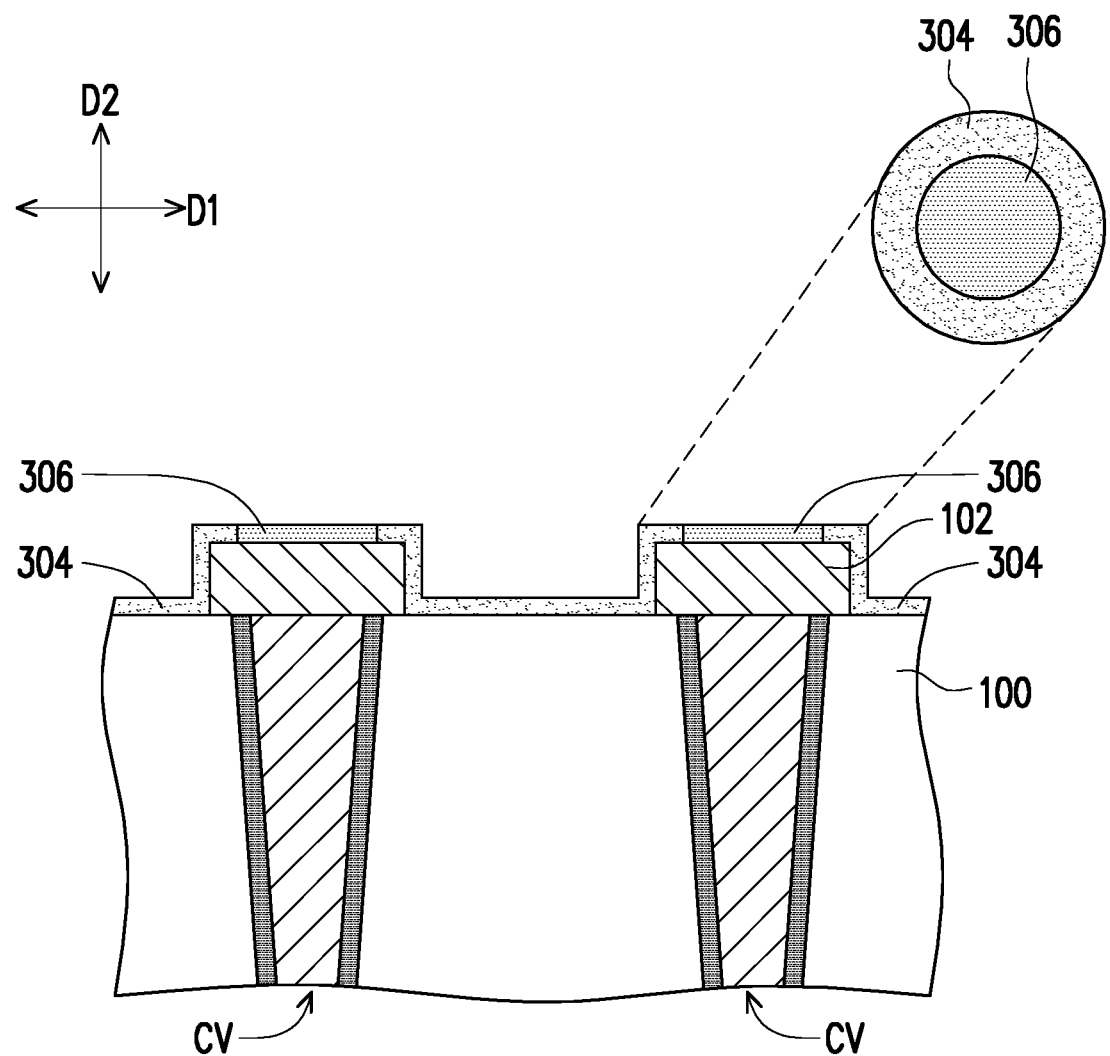

Referring to FIG. 5B and FIG. 5C, the variable resistance layer 104 is subjected to a doping process IMP2 with the photoresist pattern PR4 as a mask. As such, as shown in FIG. 5C, both of a first variable resistance layer 304 and a second variable resistance layer 306 may be formed. The second variable resistance layer 306 may be regarded as a doped portion of the variable resistance layer 104 (that is, the portion of the variable resistance layer 104 exposed by the openings P of the photoresist pattern PR4), and the first variable resistance layer 304 may be regarded as an undoped portion of the variable resistance layer 104 (that is, a portion of the variable resistance layer 104 covered by the photoresist pattern PR4). The second variable resistance layer 306 is located on the lower electrodes 102 and does not cover the sidewalls of the lower electrodes 102. In some embodiments, the width W2 of the opening P of the photoresist pattern PR4 is smaller than the width W1 of the photoresist pattern PR3 (i.e., smaller than the width of the lower electrode 102). In such embodiments, the width of the second variable resistance layer 306 is also smaller than the width of the lower electrode 102. In other words, the second variable resistance layer 306 partially covers the top surface of the lower electrode 102 without completely covering the top surface of the lower electrode 102. On the other hand, the first variable resistance layer 304 covers the sidewall of each lower electrode 102, a portion of the top surface of each lower electrode 102, and the surface of the substrate 100. In some embodiments, the first variable resistance layer 304 surrounds the second variable resistance layer 306, viewed from the top view (shown as the area indicated by the dashed line in FIG. 5C).

Figure 5D:
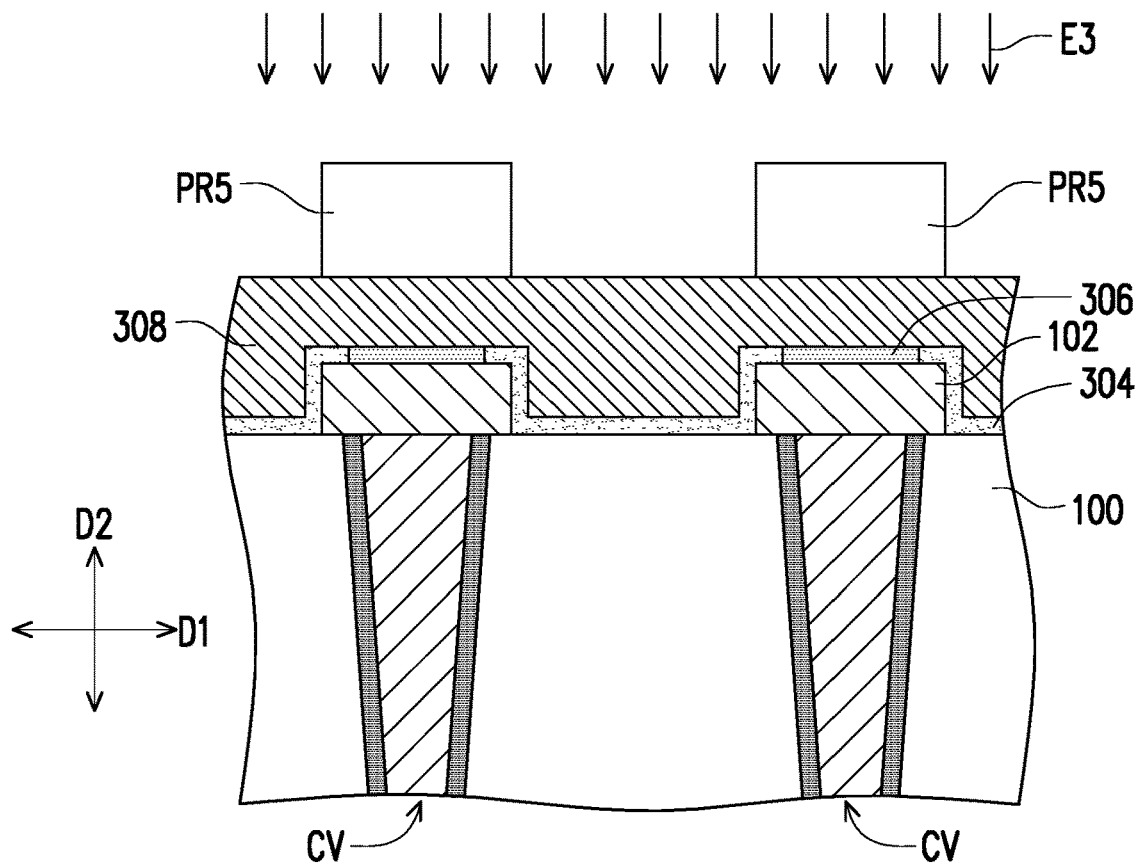
Figure 5E:
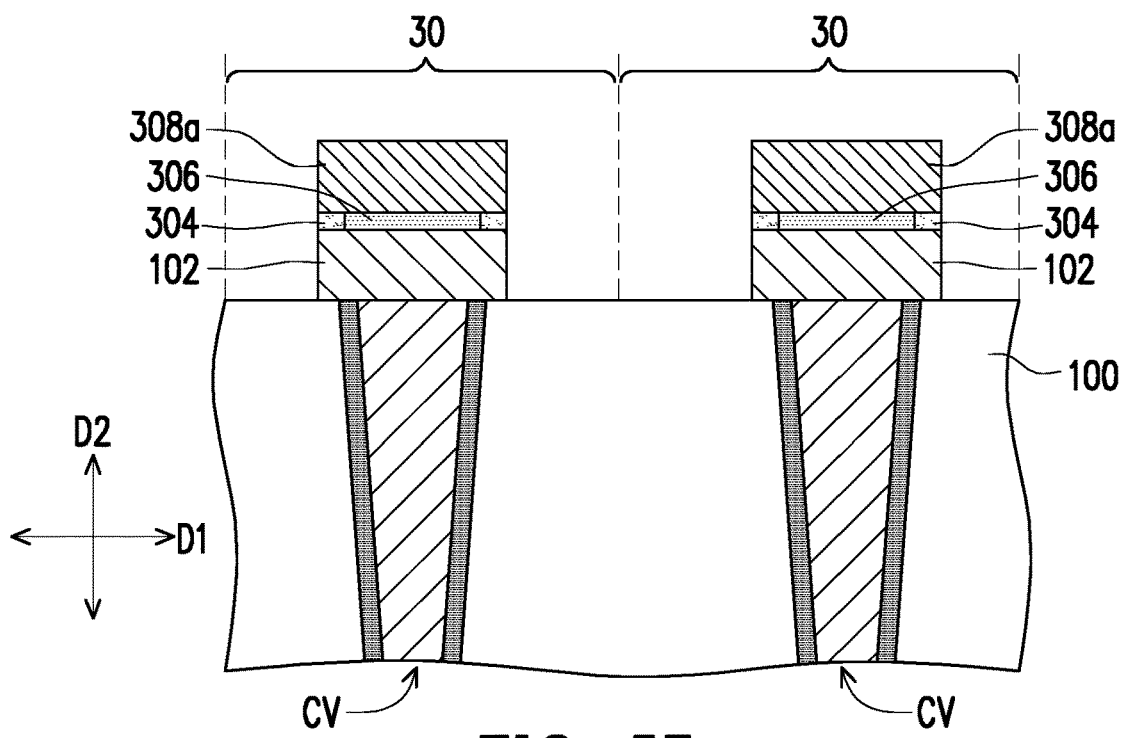

Referring to FIG. 5D and FIG. 5E, an electrode material layer 308 is formed on the first variable resistance layer 304 and the second variable resistance layer 306. Next, a photoresist pattern PR5 is formed on the electrode material layer 308. In some embodiments, the sidewall of the photoresist pattern PR5 may be substantially aligned with the sidewall of each lower electrode 102. In such embodiments, the width of the photoresist pattern PR5 may be substantially equal to the width of the lower electrode 102. Referring to FIG. 5D and FIG. 5E, an etching process E3 is then performed on the electrode material layer 308 with the photoresist pattern PR5 as a mask to form upper electrodes 308a. In some embodiments in which the sidewall of the photoresist pattern PR5 is substantially aligned with the sidewall of each lower electrode 102, the sidewall of each of the formed upper electrodes 308a may also be substantially aligned with the sidewall of each lower electrode 102. In such embodiments, a portion of the first variable resistance layer 304 is also removed when the electrode material layer 308 is patterned such that the sidewall of the remaining first variable resistance layer 304, the sidewalls of the lower electrodes 102, and the sidewalls of the upper electrodes 308a are substantially coplanar. From another viewpoint, the first variable resistance layer 304 on the lower electrode 102 has two separate portions, and the second variable resistance layer 306 on the lower electrode 102 is connected between the two portions of the first variable resistance layer 304. So far, the RRAMs 30 have been formed. The first variable resistance layer 304 and the second variable resistance layer 306 of the RRAM 30 do not overlap with each other in the direction D2 substantially perpendicular to the surface of the substrate 100. Further, the upper electrode 308a, the first variable resistance layer 304, and the second variable resistance layer 306 do not cover the sidewall of the lower electrode 102.

Figure 6:
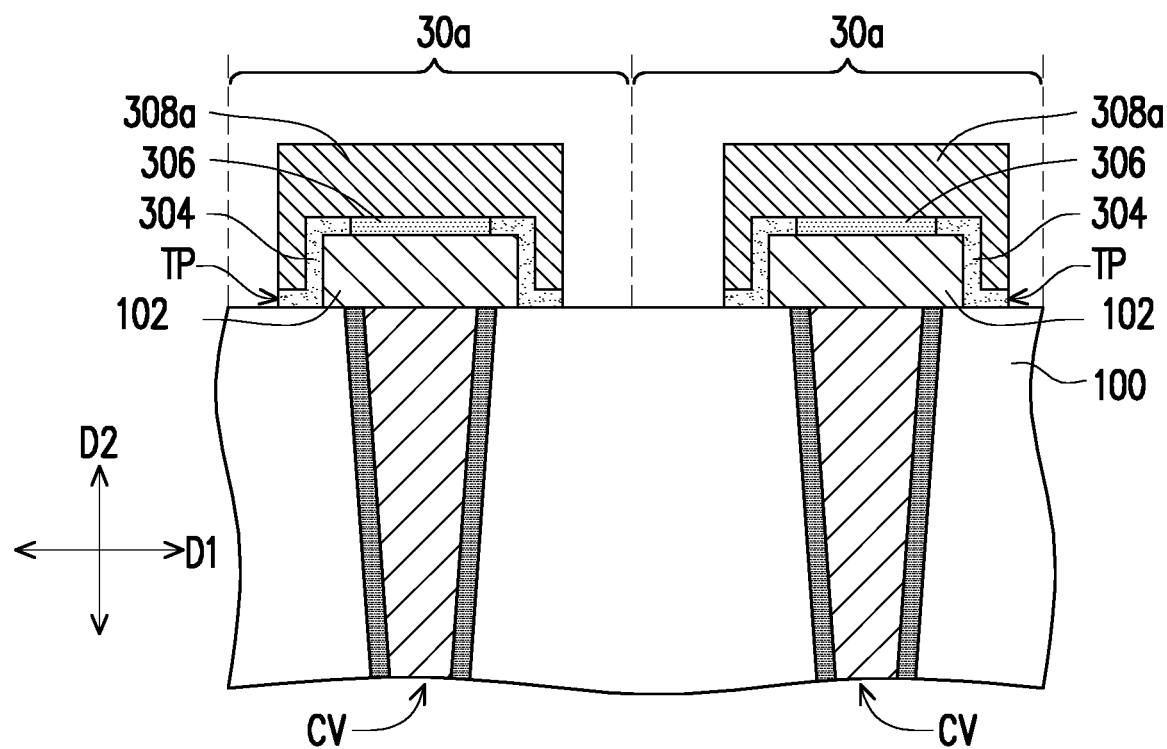
FIG. 6 is a schematic cross-sectional view of an RRAM in accordance with some embodiments of the present invention.

FIG. 6 is a schematic cross-sectional view of an RRAM 30a in accordance with some embodiments of the present invention. The RRAM 30a shown in FIG. 6 is similar to the RRAM 30 shown in FIG. 5E, and only differences between the two will be described below, and the same or similar portions will not be described again.

Referring to FIG. 6, in each RRAM 30a, the first variable resistance layer 304 and the upper electrode 308a further cover the sidewall of the lower electrode 102. As such, the first variable resistance layer 304 may be located between the sidewall of the lower electrode 102 and the edge portion of the upper electrode 308a. In some embodiments, the first variable resistance layer 304 may further be regarded as extending to the surface of the substrate 100 around the lower electrode 102 such that the ends of the first variable resistance layer 304 are located between the substrate 100 and the edge portion of the upper electrode 308a. In addition, one end surface TP of the first variable resistance layer 304 and the sidewall of the upper electrode 308a may be substantially coplanar with each other. In some embodiments, the area of the photoresist pattern PR5 (shown in FIG. 5D) for patterning the electrode material layer 308 may be increased such that the coverage of the photoresist pattern PR5 exceeds the boundary of the lower electrode 102. As a result, the upper electrode 308a and the first variable resistance layer 304 of each RRAM 30a as shown in FIG. 6 may be formed.

FIG. 7A to FIG. 7D are schematic cross-sectional views showing structures at various stages of the method of fabricating an RRAM 40 of some embodiments of the present invention. The fabricating method of the RRAM 40 shown in FIG. 7A to FIG. 7D is similar to the fabricating method of the RRAM 10 shown in FIG. 1A to FIG. 1I, and only differences between the two will be described below, and the same or similar portions will not be described again. Further, the same or similar reference numbers represent the same or similar components.

Figure 7A:
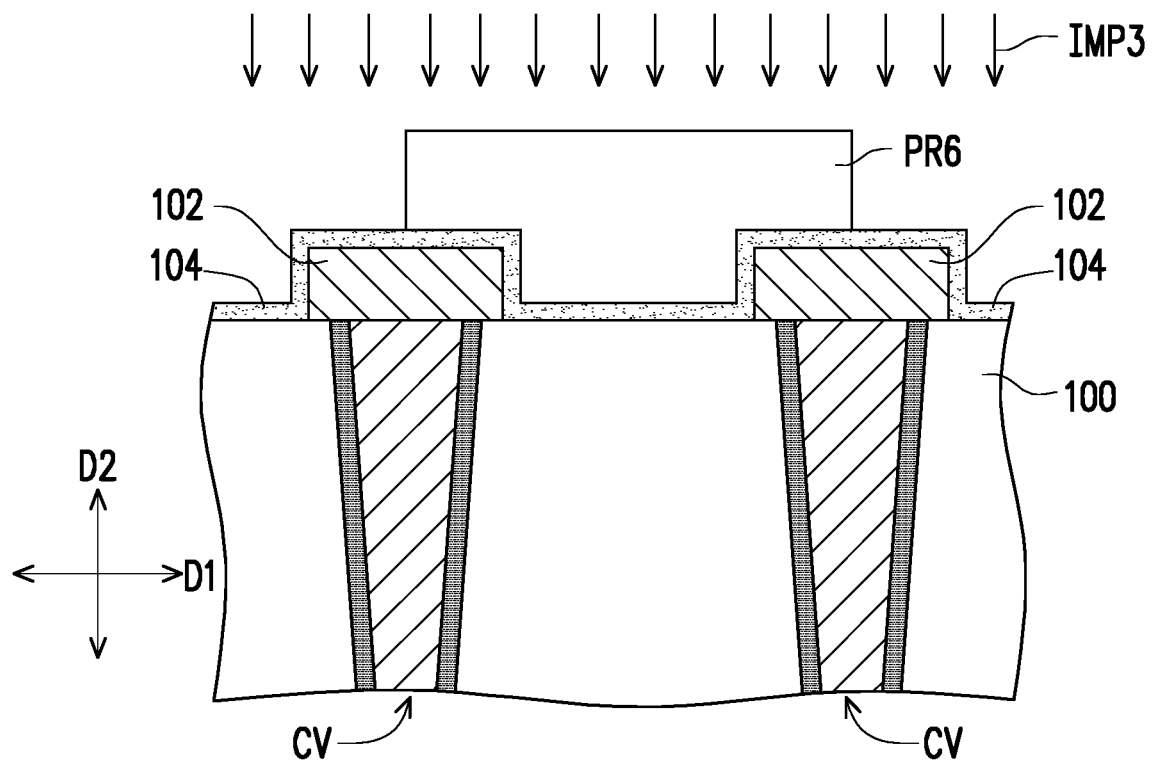
FIG. 7A to FIG. 7D are schematic cross-sectional views showing structures at various stages of a method of fabricating an RRAM according to some embodiments of the present invention.

Referring to FIG. 7A, after the variable resistance layer 104 is formed, a photoresist pattern PR6 is formed on the variable resistance layer 104. In some embodiments, the photoresist pattern PR6 is disposed between the adjacent lower electrodes 102 and extends onto the adjacent lower electrodes 102. In these embodiments, the portion of the variable resistance layer 104 on the lower electrodes 102 is not completely covered by the photoresist pattern PR6, but is partially exposed by the photoresist pattern PR6.

Figure 7B:
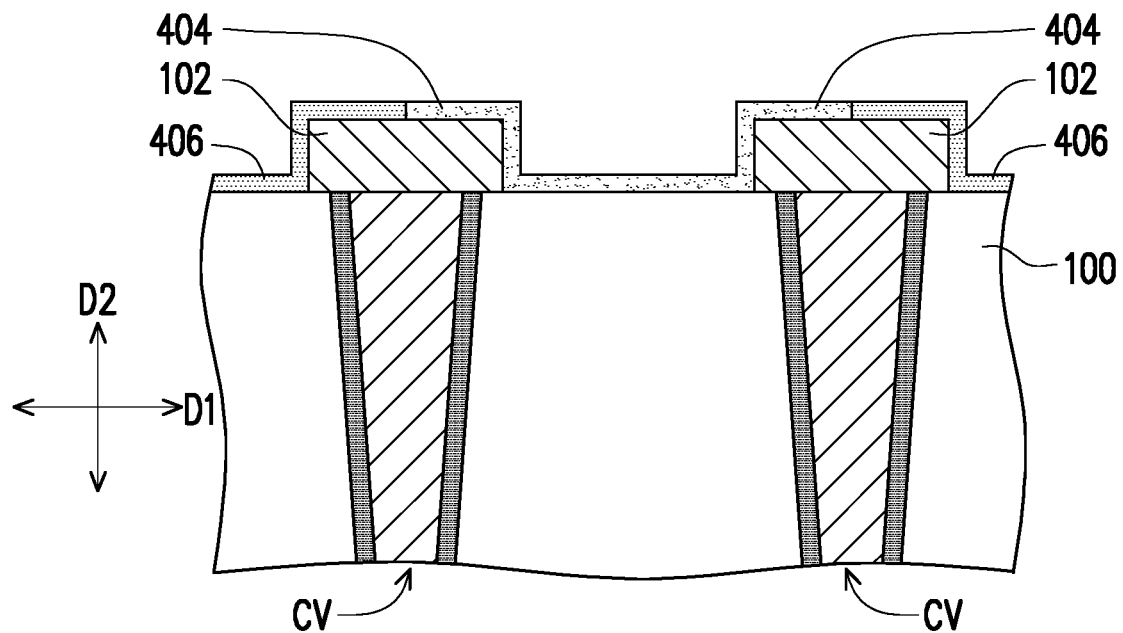

Referring to FIG. 7A and FIG. 7B, a doping process IMP3 is performed with the photoresist pattern PR6 as a mask. As a result, as shown in FIG. 7B, both of a first variable resistance layer 404 and a second variable resistance layer 406 may be formed. The second variable resistance layer 406 may be regarded as a doped portion of the variable resistance layer 104 (that is, a portion of the variable resistance layer 104 exposed by the photoresist pattern PR6), and the first variable resistance layer 404 may be regarded as an undoped portion of the variable resistance layer 104 (that is, a portion of the variable resistance layer 104 covered by the photoresist pattern PR6). The surface of each of the lower electrodes 102 may be covered by the first variable resistance layer 404 and the second variable resistance layer 406. For example, a portion of the surface of each lower electrode 102 (e.g., the right half or the left half shown in FIG. 7B) may be covered by the first variable resistance layer 404 while another portion of the surface of each lower electrode 102 may be covered by the second variable resistance layer 406. Further, the first variable resistance layer 404 and the second variable resistance layer 406 extend to the sidewall of each lower electrode 102 and the substrate 100 located around the lower electrodes 102.

Figure 7C:
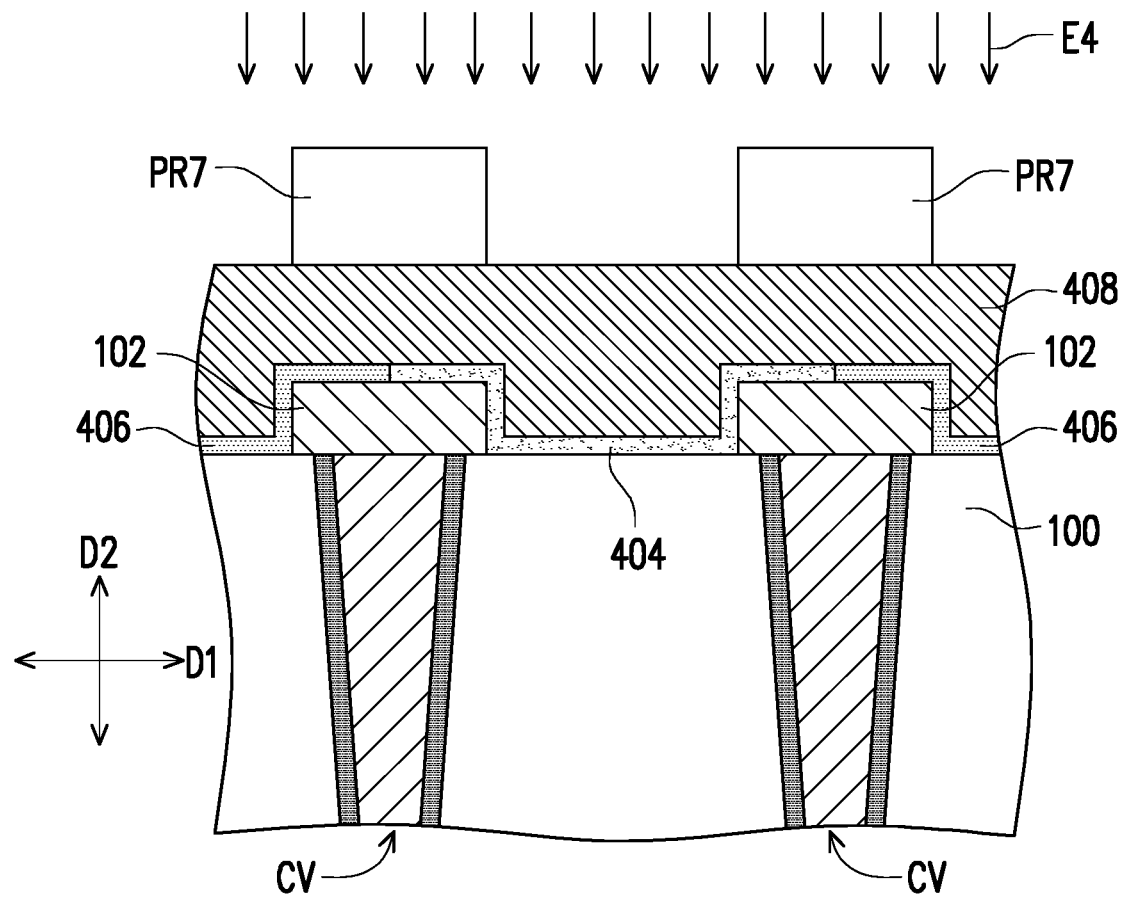
Figure 7D:
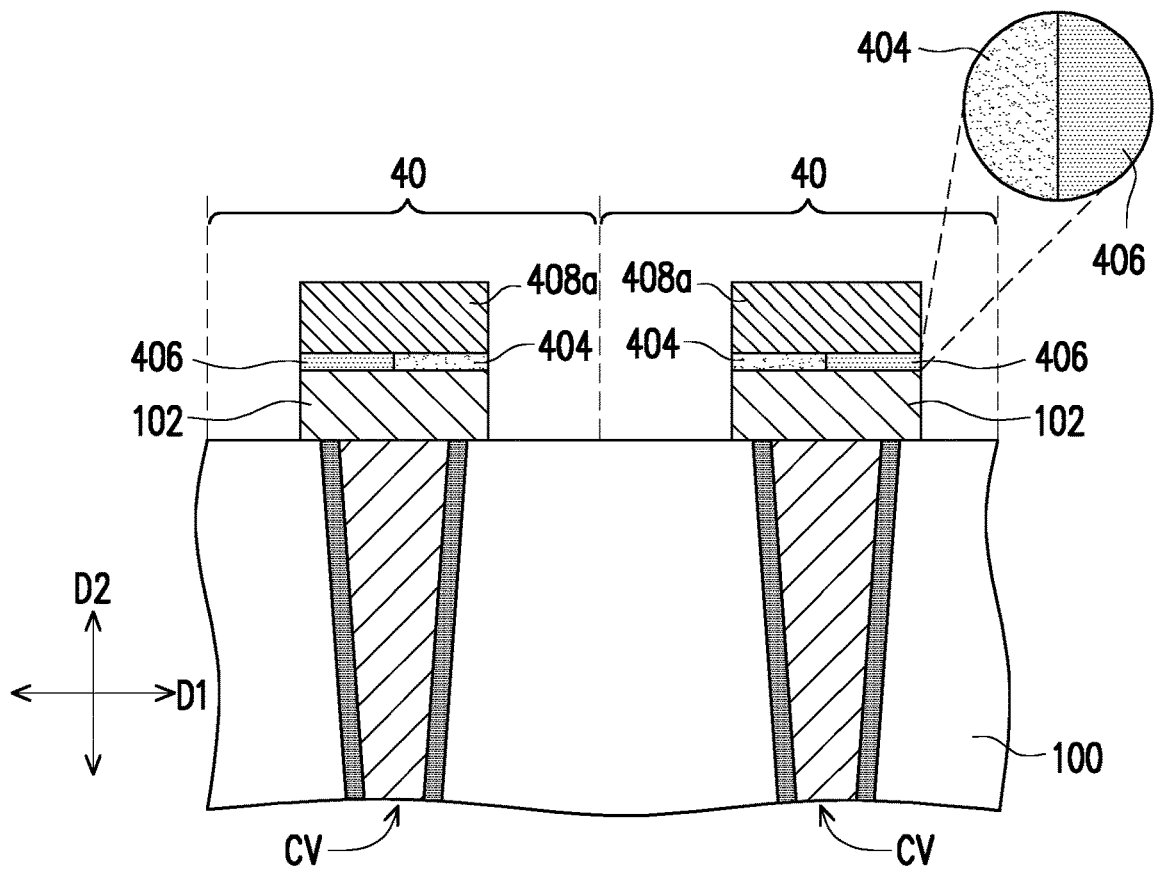

Referring to FIG. 7C, an electrode material layer 408 is formed on the first variable resistance layer 404 and the second variable resistance layer 406. Next, a photoresist pattern PR7 is formed on the electrode material layer 408. In some embodiments, the sidewall of the photoresist pattern PR7 may be substantially aligned with the sidewall of each lower electrode 102. In such embodiments, the width of the photoresist pattern PR7 may be substantially equal to the width of the lower electrode 102. Referring to FIG. 7C and FIG. 7D, an etching process E4 is then performed on the electrode material layer 408 with the photoresist pattern PR7 as a mask to form upper electrodes 408a. In some embodiments in which the sidewall of the photoresist pattern PR7 is substantially aligned with the sidewall of each lower electrode 102, the sidewall of each of the formed upper electrodes 408a may also be substantially aligned with the sidewall of each lower electrode 102. In such embodiments, a portion of the first variable resistance layer 404 and a portion of the second variable resistance layer 406 are also removed when the electrode material layer 408 is patterned, such that the sidewall of the remaining first variable resistance layer 404, the sidewalls of the lower electrodes 102, and the sidewalls of the upper electrodes 408a are substantially coplanar. Similarly, the sidewall of the remaining second variable resistance layer 406, the sidewalls of the lower electrodes 102, and the sidewalls of the upper electrodes 408a may also be substantially coplanar. So far, the RRAMs 40 have been formed. Viewed from the top view (shown as the area indicated by the dashed line in FIG. 7D), the first variable resistance layer 404 and the second variable resistance layer 406 of each RRAM 40 are adjacent to each other and do not overlap with each other. The first variable resistance layer 404 of each RRAM 40 shown in FIG. 7D is continuously extended on the top surface of the lower electrode 102 compared to the first variable resistance layer 304 of each RRAM 30 shown in FIG. 5E. Further, the upper electrode 408a, the first variable resistance layer 404, and the second variable resistance layer 406 do not cover the sidewall of the lower electrode 102.

Figure 8:
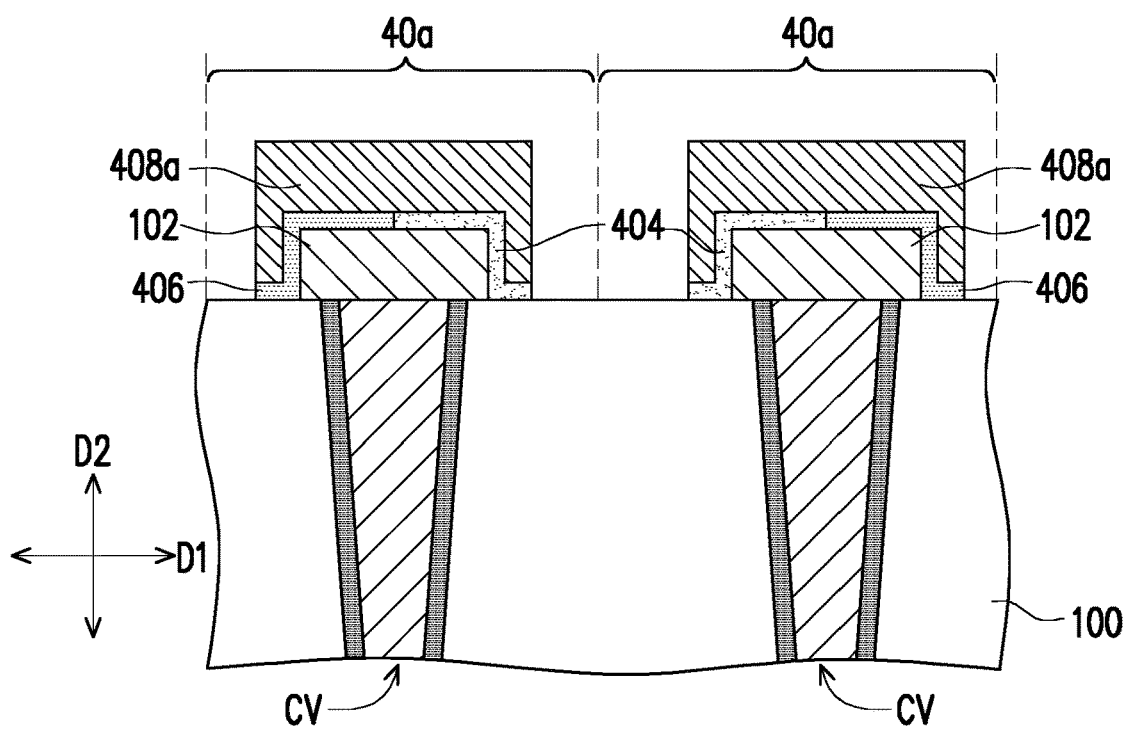
FIG. 8 is a schematic cross-sectional view of an RRAM in accordance with some embodiments of the present invention.

FIG. 8 is a schematic cross-sectional view of an RRAM 40a in accordance with some embodiments of the present invention. The RRAM 40a shown in FIG. 8 is similar to the RRAM 40 shown in FIG. 7D, and only differences between the two will be described below, and the same or similar portions will not be described again.

Referring to FIG. 8, the first variable resistance layer 404, the second variable resistance layer 406 and the upper electrode 408a of each RRAM 40a cover the sidewall of the lower electrode 102. As such, the first variable resistance layer 404 may further be located between the sidewall of the lower electrode 102 and the edge portion of the upper electrode 408a. Similarly, the second variable resistance layer 406 may further be located between the sidewall of the lower electrode 102 and the other edge portion of the upper electrode 408. In some embodiments, the first variable resistance layer 404 and the second variable resistance layer 406 may further be regarded as extending to the surface of the substrate 100 around the lower electrode 102 such that the end of the first variable resistance layer 404 is located between the substrate 100 and the edge portion of the upper electrode 408a. Similarly, the end of the second variable resistance layer 406 may be located between the substrate 100 and the other edge portion of the upper electrode 408a. In some embodiments, the area of the photoresist pattern PR7 (shown in FIG. 7D) for patterning the electrode material layer 408 may be increased such that the coverage of the photoresist pattern PR7 exceeds the boundary of the lower electrode 102. As a result, the upper electrode 408a, the first variable resistance layer 404, and the second variable resistance layer 406 of each RRAM 40a as shown in FIG. 8 may be formed.

FIG. 9A to FIG. 9E are schematic cross-sectional views showing structures at various stages of the method of fabricating an RRAM 50 of some embodiments of the present invention. The fabricating method of the RRAM 50 shown in FIG. 9A to FIG. 9E is similar to the fabricating method of the RRAM 10 shown in FIG. 1A to FIG. 1I, and only differences between the two will be described below, and the same or similar portions will not be described again. Further, the same or similar reference numbers represent the same or similar components.

Figure 9A:
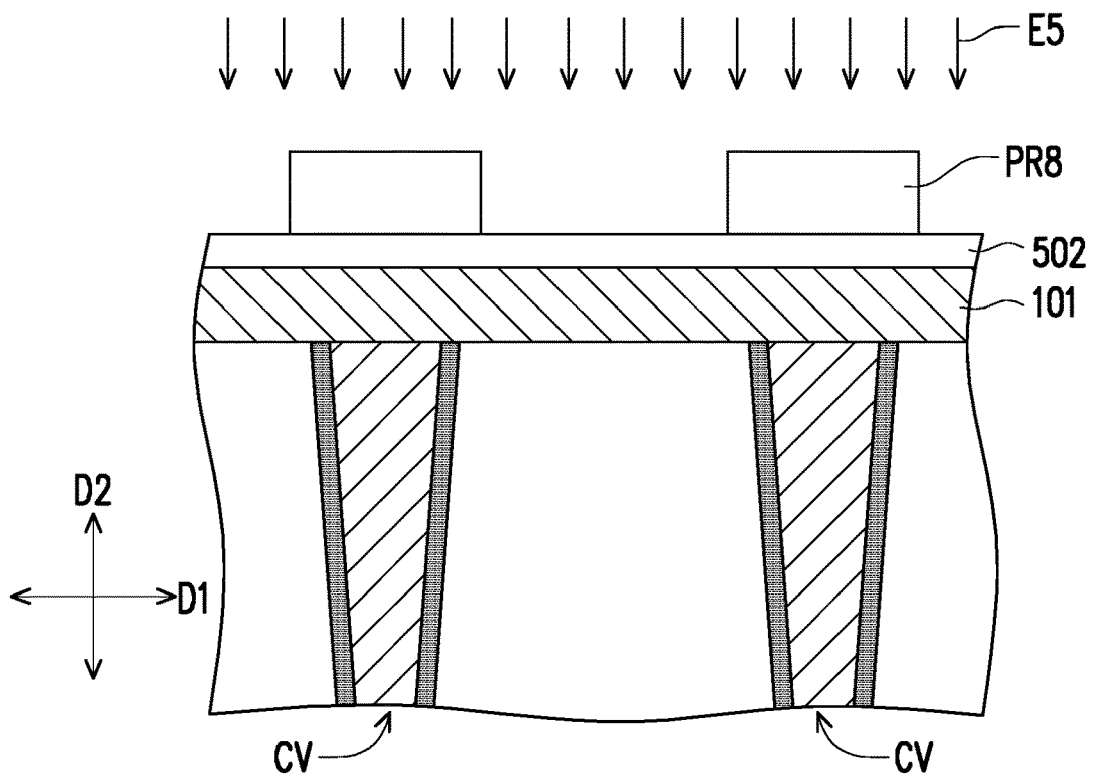
FIG. 9A to FIG. 9E are schematic cross-sectional views showing structures at various stages of a method of fabricating an RRAM according to some embodiments of the present invention.

Referring to FIG. 9A, an electrode material layer 101 and a protective layer 502 are sequentially formed on the substrate. In some embodiments, the material of the protective layer 502 includes silicon oxide, silicon nitride, the like, or a combination thereof. The method of forming the protective layer 502 may include a chemical vapor deposition method. The thickness of the first protective layer 502 may range from 3 nm to 20 nm. Next, referring to FIG. 9A and FIG. 9B, the electrode material layer 101 and the protective layer 502 are patterned to form a first stacked structure ST1 and a second stacked structure ST2. The first stacked structure ST1 includes a first lower electrode 102a and an overlying third protective layer 502a, and the second stacked structure ST2 includes a second lower electrode 102b and an overlying fourth protective layer 502b. Although FIG. 9B only shows the single first stacked structure ST1 and the single second stacked structure ST2, a plurality of first stacked structures ST1 and a plurality of second stacked structures ST2 may be alternately disposed on the substrate 100 in the direction D1. In some embodiments, the method of patterning the electrode material layer 101 and the protective layer 502 includes forming a photoresist pattern PR8 on the protective layer 502. The photoresist pattern PR8 defines patterns of the first stacked structure ST1 and the second stacked structure ST2. Subsequently, an etching process E5 is performed with the photoresist pattern PR8 as a mask to remove a portion of the electrode material layer 101 and a portion of the protective layer 502. In this way, both of the first stacked structure ST1 and the second stacked structure ST2 may be formed. The first lower electrode 102a and second lower electrode 102b adjacent to each other may be a pair of electrodes, and are electrically connected to the same transistor by two interconnect structures (including the conductive vias CV). In this way, the first lower electrode 102a and the second lower electrode 102b may receive the same driving signal from the said transistor. In some embodiments, in the first stacked structure ST1, the sidewall of the first lower electrode 102a and the sidewall of the third protective layer 502a may be substantially coplanar. Similarly, in the second stack structure ST2, the sidewall of the second lower electrode 102b and the sidewall of the fourth protective layer 502b may be substantially coplanar.

Figure 9B:
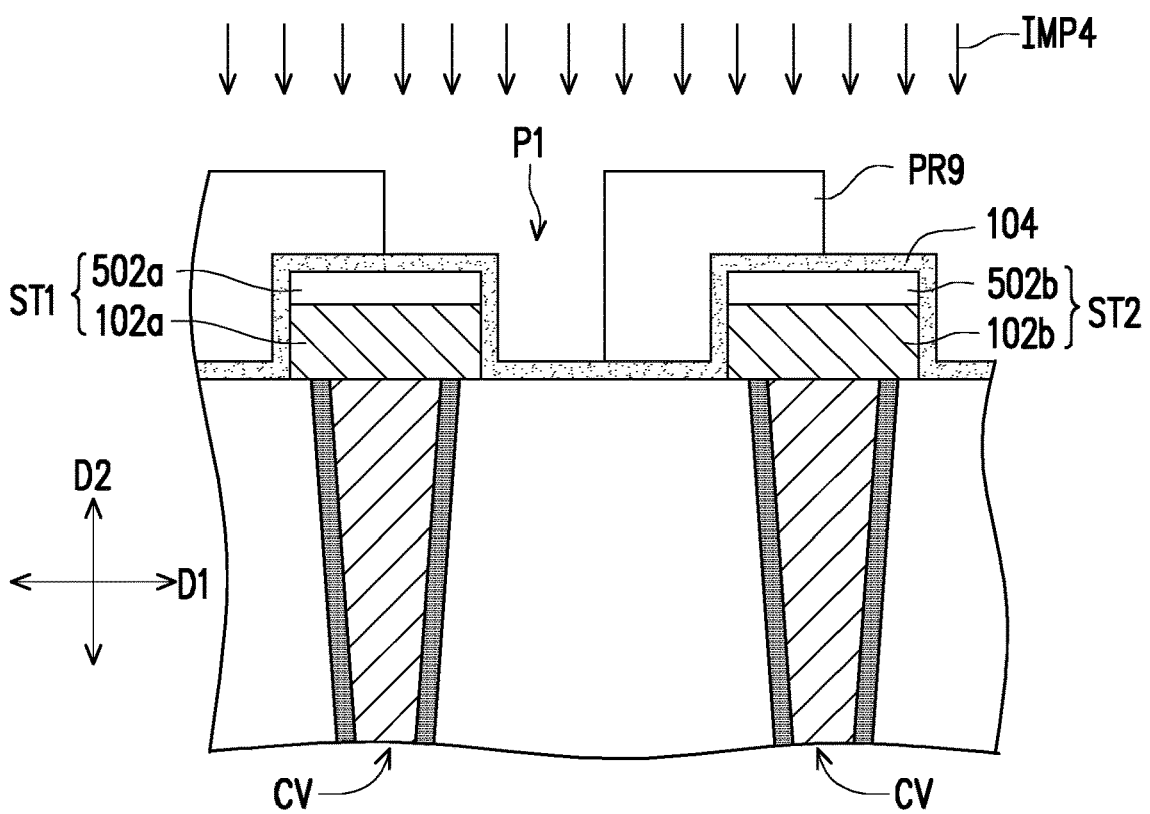

Referring to FIG. 9B, a variable resistance layer 104 is formed. In some embodiments, the variable resistance layer 104 is conformally disposed on the first stacked structure ST1 and the second stack structure ST2. In other words, the variable resistance layer 104 covers the surface of the substrate 100, the top surface and the sidewall of the first stacked structure ST1, and the top surface and the sidewall of the second stacked structure ST2. Next, a photoresist pattern PR9 is formed on the variable resistance layer 104. The photoresist pattern PR9 has openings P1. One of the openings P1 overlaps a portion of the first stacked structure ST1 near the second stacked structure ST2 in the direction D2, and another one of the openings P1 exposes a portion of the second stacked structure ST2 close to another first stacked structure (not shown). In some embodiments, the opening P1 further extends to between the first stacked structure ST1 and the second stacked structure ST2 to expose a portion of the variable resistance layer 104 between the first stacked structure ST1 and the second stacked structure ST2.

Figure 9C:
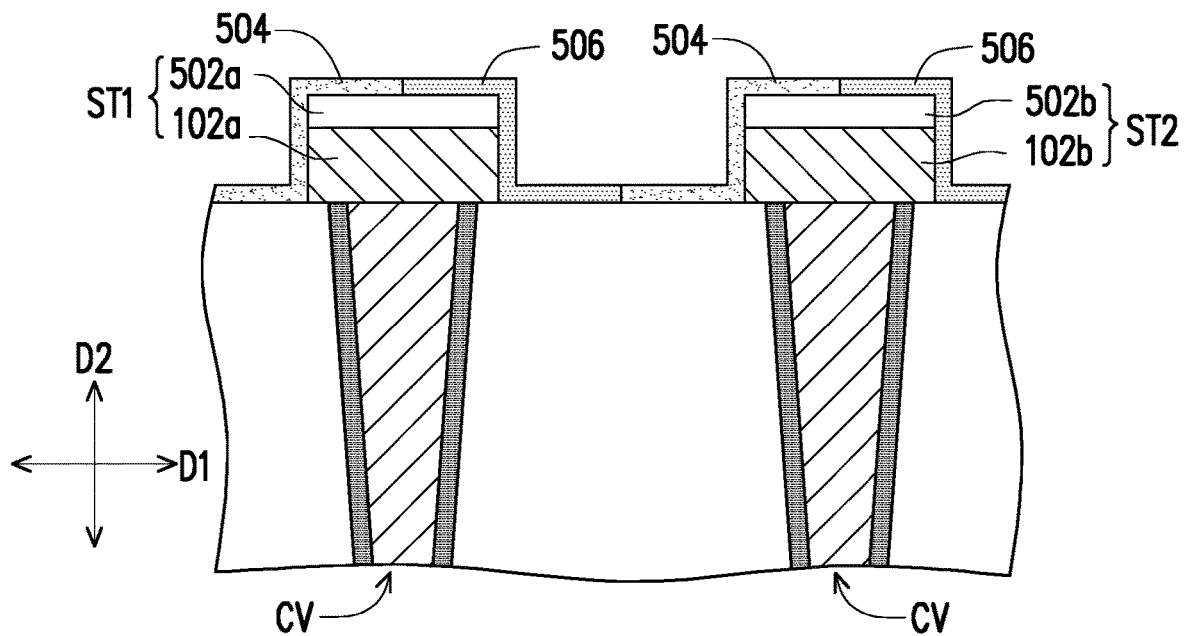

Referring to FIG. 9B and FIG. 9C, a doping process IMP4 is performed with the photoresist pattern PR9 as a mask. As such, as shown in FIG. 9C, first variable resistance layers 504 and second variable resistance layers 506 may be simultaneously formed. The second variable resistance layer 506 may be regarded as a doped portion of the variable resistance layer 104 (that is, a portion of the variable resistance layer 104 exposed by the openings P1 of the photoresist pattern PR9), and the first variable resistance layer 504 may be regarded as an undoped portion of the variable resistance layer 104 (that is, a portion of the variable resistance layer 104 covered by the photoresist pattern PR9). The surface of the first stacked structure ST1 may be covered by the first variable resistance layer 504 and the second variable resistance layer 506, and the surface of the second stacked structure ST2 may also be covered by the first variable resistance layer 504 and the second variable resistance layer 506. For example, a portion of the surface of the first stacked structure ST1 (e.g., the left half of the first stacked structure ST1 shown in FIG. 9C) may be covered by the first variable resistance layer 504, and another portion of the surface of the first stacked structure ST1 (e.g., the right half of the first stacked structure ST1 shown in FIG. 9C) may then be covered by the second variable resistance layer 506. Similarly, a portion of the surface of the second stacked structure ST2 (e.g., the left half of the second stacked structure ST2 shown in FIG. 9C) may be covered by the first variable resistance layer 504, and another portion of the surface of the second stacked structure ST2 (e.g., the right half of the second stacked structure ST2 shown in FIG. 9C) may then be covered by the second variable resistance layer 506. It can be seen that the third protective layer 502a is located between the top surface of the first lower electrode 102a and the overlying first variable resistance layer 504 and between the top surface of the first lower electrode 102a and the overlying second variable resistance layer 506. Similarly, the fourth protective layer 502b is located between the top surface of the second lower electrode 102b and the overlying first variable resistance layer 504 and between the top surface of the second lower electrode 102b and the overlying second variable resistance layer 506. However, by adjusting the position and the area of the openings of the photoresist pattern PR9 shown in FIG. 9B, the position of each first variable resistance layer 504 and the position of each second variable resistance layer 506 may be interchanged, and the area ratio of the first variable resistance layer 504 to the second variable resistance layer 506 may be adjusted. In addition, each first variable resistance layer 504 and each second variable resistance layer 506 may extend onto the substrate 100 around each stacked structure, and the first variable resistance layer 504 and the second variable resistance layer 506 adjacent to each other may be connected with each other.

Figure 9D:
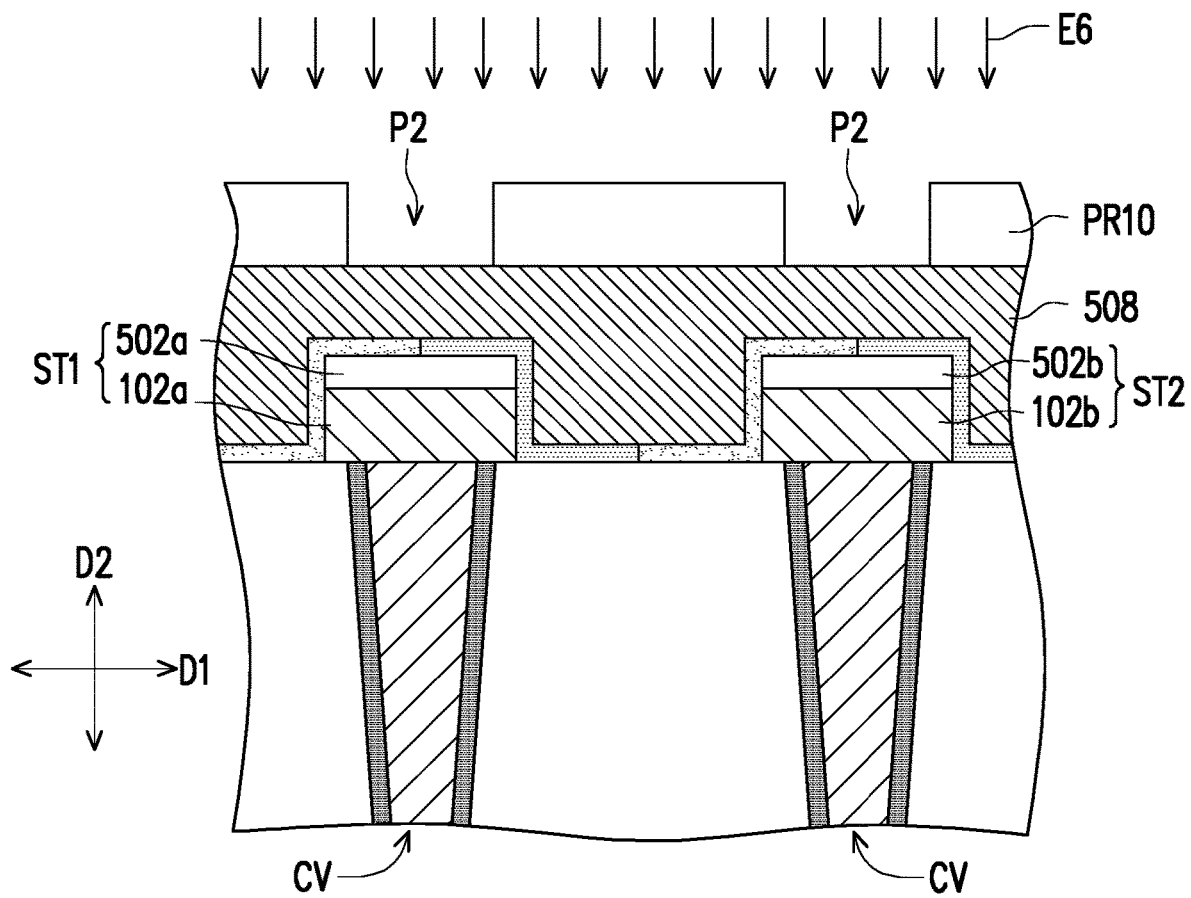
Figure 9E:
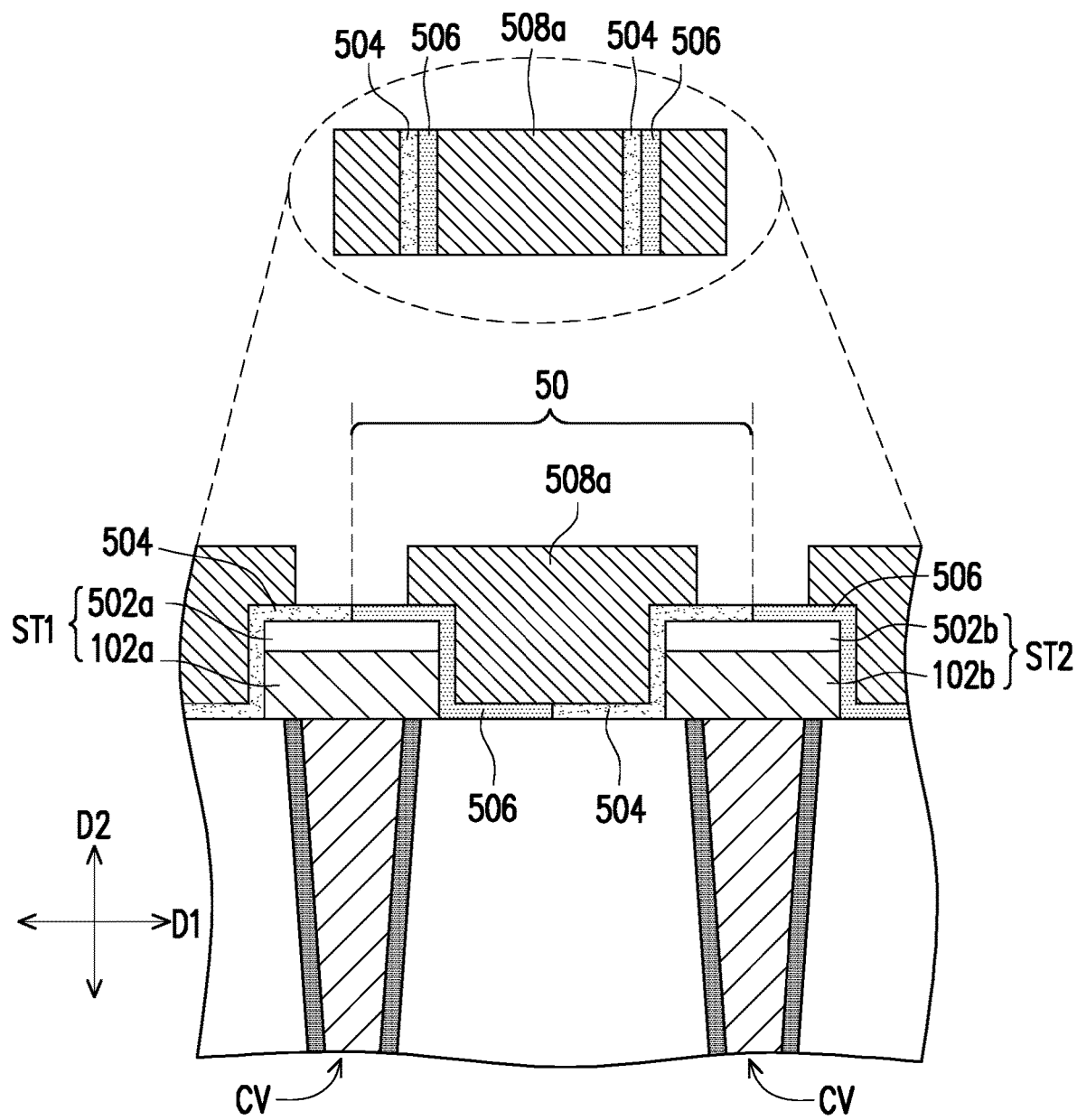

Referring to FIG. 9D, an electrode material layer 508 is formed. In some embodiments, the electrode material layer 508 is entirely overlying the structure shown in FIG. 9C. In other words, the electrode material layer 508 covers the top surfaces of the first variable resistance layers 504 and the second variable resistance layers 506. Next, a photoresist pattern PR10 is formed on the electrode material layer 508. The photoresist pattern PR10 has openings P2. One of the openings P2 overlaps a portion of the first stacked structure ST1 in the direction D2 and another one of the openings P2 overlaps a portion of the second stacked structure ST2 in the direction D2. As such, the opening P2 may expose a portion of the electrode material layer 508 on the first stacked structure ST1. Similarly, the opening P2 may expose a portion of the electrode material layer 508 on the second stack structure ST2. In some embodiments, the width of the opening P2 is smaller than the width of the first stacked structure ST1 or the width of the second stacked structure ST2. Referring to FIG. 9D and FIG. 9E, an etching process E6 is then performed on the electrode material layer 508 with the photoresist pattern PR10 as a mask to form upper electrodes 508a. The upper electrode 508a is located between the first stack structure ST1 and the second stack structure ST2 adjacent to each other, and the upper electrode 508a covers a portion of the first variable resistance layer 504 between the first stack structure ST1 and the second stack structure ST2 and a portion of the second variable resistance layer 506 between the first stack structure ST1 and the second stack structure ST2. In some embodiments, the upper electrode 508a may further be regarded as extending onto the first stacked structure ST1 and the second stacked structure ST2, but the upper electrode 508a does not completely cover the top surfaces of the first stacked structure ST1 and the second stacked structure ST2. Viewed from the top view (shown as the area enclosed by the dashed line in FIG. 9E), the exposed portions of the first variable resistance layers 504 and the second variable resistance layers 506 respectively are located between the adjacent upper electrodes 508a. Further, in some embodiments, the first stack structure ST1 and the second stack structure ST2 may be in strip shapes and extend on the substrate 100 in substantially the same direction.

So far, the RRAM 50 has been formed. The lower electrode of the RRAM 50 is a pair of electrodes that are electrically connected to each other, and include, for example, the first lower electrode 102a and the second lower electrode 102b. Further, the upper electrode 508a is disposed between the first lower electrode 102a and the second lower electrode 102b. The upper electrode 508a overlaps the first lower electrode 102a or the second lower electrode 102b obliquely or laterally. The second variable resistance layer 506 may be disposed between the first lower electrode 102a and the upper electrode 508a, and the first variable resistance layer 504 may be disposed between the second lower electrode 102b and the upper electrode 508a. It can be seen that similar to the foregoing embodiments, the RRAM 50 also has a plurality of variable resistance layers between the upper and lower electrodes, thereby achieving effects of improving storage density, improving data retention capability, and improving the problem of current degradation.

Figure 10A:
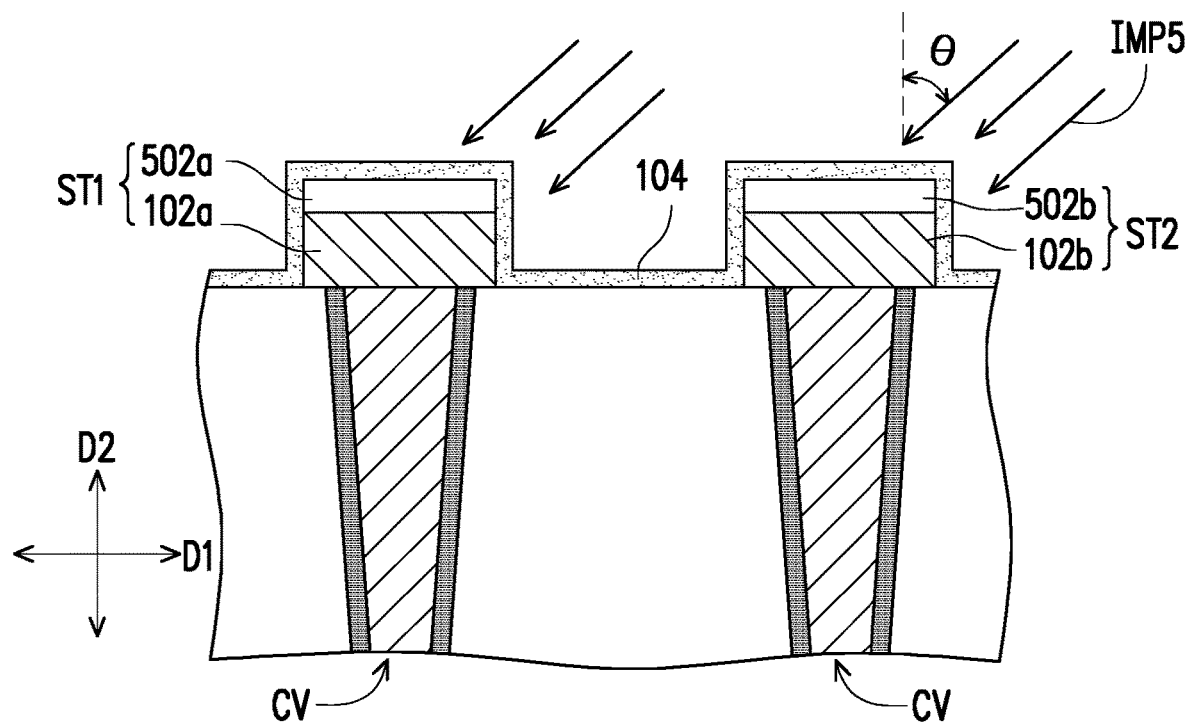
FIG. 10A to FIG. 10C are schematic cross-sectional views showing structures at various stages of a method of fabricating an RRAM according to some embodiments of the present invention.
Figure 10B:
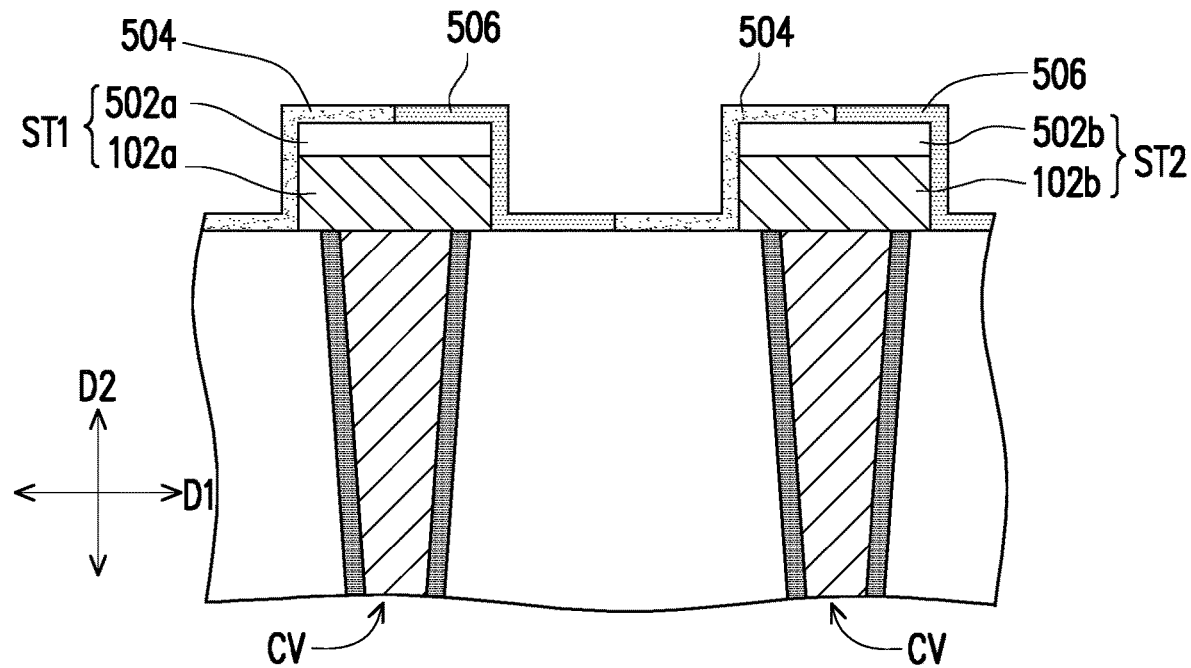
Figure 10C:
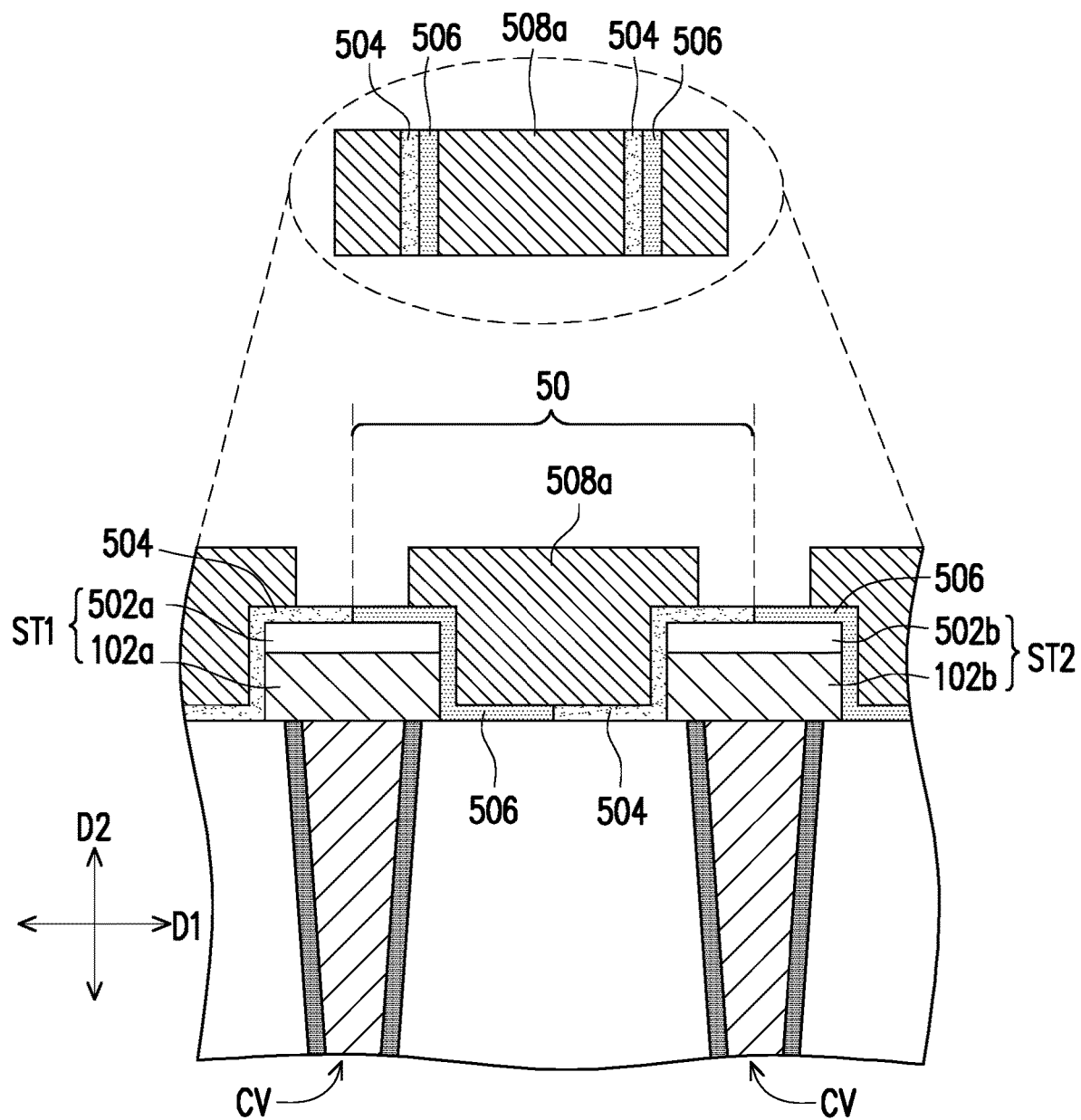

FIG. 10A to FIG. 10C are schematic cross-sectional views showing structures at various stages of another fabricating method of the RRAM 50. The fabricating method of the RRAM 50 shown in FIG. 10A to FIG. 10C is similar to the fabricating method of the RRAM 50 shown in FIG. 9A to FIG. 9E, and only differences between the two will be described below, and the same or similar portions will not be described again. Further, the same reference numbers represent the same or similar components.

Referring to FIG. 10A and FIG. 10B, after the first stacked structure ST1, the second stacked structure ST2, and the variable resistance layer 104 are formed, a doping process IMP5 is performed. In the doping process IMP5, the dopant may be implanted obliquely into the variable resistance layer 104. In some embodiments, the angle θ between the incident direction of the dopant and the direction D2 substantially perpendicular to the surface of the substrate 100 may be 30 degrees to 60 degrees. A portion of the variable resistance layer 104 facing the incident dopant (for example, incident from the right side of FIG. 10B) is doped to form the second variable resistance layer 506. On the other hand, the other portion of the variable resistance layer 104 is undoped and is designated as the first variable resistance layer 504. However, by adjusting the incident direction of the dopant of the doping process IMP5, the position of each first variable resistance layer 504 and the position of each second variable resistance layer 506 may be interchanged, or the area ratio of the first variable resistance layer 504 to the second variable resistance layer 506 may be changed. The embodiment of the present invention is not limited to the relative positional relationship between the first variable resistance layer 504 and the second variable resistance layer 506 and the area ratio of the first variable resistance layer 504 to the second variable resistance layer 506.

Referring to FIG. 10C, the upper electrodes 508a are formed. The method of forming the upper electrodes 508a may refer to the method described in FIG. 9D to FIG. 9E, and details are not described herein again. So far, the RRAM 50 has been completed formed by another fabricating method.

In summary, in the embodiment of the present invention, by providing the first variable resistance layer and the second variable resistance layer between the lower electrode and the upper electrode of the RRAM, the single RRAM can have at least two different low resistance states when turned on. On the other hand, the RRAM has a single high resistance state in the off state. In this way, a single RRAM can have at least 3 programming levels and can store 1.5 bits of data. In other words, the RRAM of the embodiment of the present invention can increase the storage density as compared with the RRAM having only a single variable resistance layer between the upper and lower electrodes. Furthermore, through the material selection of the first and second variable resistance layers, the RRAM of the embodiment of the present invention is more likely to increase the current on/off ratio while maintaining the threshold voltage. As a result, the data retention capability of the RRAM can be improved, and the problem of current degradation can be improved.

Although the present invention has been disclosed in the above embodiments, it is not intended to limit the present invention, and any one of ordinary skill in the art can make some changes and refinements without departing from the spirit and scope of the present invention. The scope of the invention is defined by the scope of the appended claims.

What is claimed is:

1. A resistive random access memory, comprising:
   a lower electrode disposed on a substrate, wherein the lower electrode is a single electrode or a pair of electrodes electrically connected to each other;
   an upper electrode, disposed on the lower electrode and overlapping the lower electrode, wherein the upper electrode covers a sidewall of the lower electrode;
   a first variable resistance layer and a second variable resistance layer disposed on the substrate, wherein at least a portion of the first variable resistance layer is disposed between the lower electrode and the upper electrode, wherein at least a portion of the second variable resistance layer is disposed between the lower electrode and the upper electrode and connected to the first variable resistance layer; and
   a conductive via disposed in the substrate and under the lower electrode and electrically connected with the lower electrode.

2. The resistive random access memory according to claim 1, wherein the lower electrode is the single electrode.

3. The resistive random access memory of claim 2, wherein the upper electrode covers a top surface of the lower electrode.

4. The resistive random access memory according to claim 3, wherein the first variable resistance layer and the second variable resistance layer are located between the lower electrode and the upper electrode.

5. The resistive random access memory according to claim 3, wherein a portion of the second variable resistance layer is located between the lower electrode and the upper electrode, and another portion of the second variable resistance layer is located on opposite sides of the lower electrode and between the upper electrode and the substrate.

6. The resistive random access memory according to claim 3, wherein
   a portion of the first variable resistance layer is located between the lower electrode and the upper electrode, and another portion of the first variable resistance layer is located on a side of the lower electrode and between the upper electrode and the substrate; and
   a portion of the second variable resistance layer is located between the lower electrode and the upper electrode, and another portion of the second variable resistance layer is located on another side of the lower electrode and between the upper electrode and the substrate.

7. The resistive random access memory according to claim 3, wherein the first variable resistance layer overlaps the at least a portion of the second variable resistance layer in a direction substantially perpendicular to a surface of the substrate.

8. The resistive random access memory according to claim 7, further comprising a first protective layer disposed between the upper electrode and the lower electrode, and overlapping the top surface of the lower electrode in the direction substantially perpendicular to the surface of the substrate.

9. The resistive random access memory according to claim 7, further comprising a second protective layer disposed between the at least a portion of the first variable resistance layer and the second variable resistance layer.

10. The resistive random access memory of claim 3, wherein the first variable resistance layer and the second variable resistance layer do not overlap with each other in a direction substantially perpendicular to a surface of the substrate.

11. The resistive random access memory according to claim 3, wherein the first variable resistance layer and the second variable resistance layer are located between the lower electrode and the upper electrode, and the first variable resistance layer and the second variable resistance layer do not overlap with each other in a direction substantially perpendicular to a surface of the substrate.

12. The resistive random access memory according to claim 11, wherein the first variable resistance layer has two separate portions, and the second variable resistance layer is connected between the two portions of the first variable resistance layer.

13. The resistive random access memory according to claim 11, wherein the first variable resistance layer is continuously extended on the top surface of the lower electrode.

14. The resistive random access memory according to claim 1, wherein the lower electrode is the pair of electrodes, and the pair of electrodes includes a first lower electrode and a second lower electrode adjacent to each other, and the upper electrode is disposed between the first lower electrode and the second lower electrode.

15. The resistive random access memory of claim 14, wherein the at least a portion of the second variable resistance layer is disposed between the upper electrode and the first lower electrode, and the at least a portion of the first variable resistance layer is disposed between the upper electrode and the second lower electrode.

16. The resistive random access memory according to claim 15, further comprising a third protective layer disposed between a top surface of the first lower electrode and the second variable resistance layer.

17. The resistive random access memory according to claim 15, further comprising a fourth protective layer disposed between a top surface of the second lower electrode and the first variable resistance layer.

18. The resistive random access memory according to claim 1, wherein the first variable resistance layer has a first surface extending along a thickness direction of the first variable resistance layer, the second variable resistance layer has a second surface extending along a thickness direction of the second variable resistance layer, the first variable resistance layer and the second variable resistance layer connect with each other via the first surface and the second surface, and the second variable resistance layer is located on entire top surface of the lower electrode.

* * * * *